(12) United States Patent
Takeshita

(10) Patent No.: US 8,216,764 B2
(45) Date of Patent: Jul. 10, 2012

(54) POSITIVE RESIST COMPOSITION AND METHOD OF FORMING RESIST PATTERN

(75) Inventor: Masaru Takeshita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 92 days.

(21) Appl. No.: 12/305,575

(22) PCT Filed: May 18, 2007

(86) PCT No.: PCT/JP2007/060253
§ 371 (c)(1),
(2), (4) Date: Dec. 18, 2008

(87) PCT Pub. No.: WO2007/148492
PCT Pub. Date: Dec. 27, 2007

(65) Prior Publication Data
US 2009/0286179 A1 Nov. 19, 2009

(30) Foreign Application Priority Data
Jun. 23, 2006 (JP) ................................ 2006-173919

(51) Int. Cl.
*G03F 7/039* (2006.01)
*G03F 7/20* (2006.01)
*G03F 7/30* (2006.01)

(52) U.S. Cl. ............. 430/270.1; 430/311; 430/326; 430/910; 430/921

(58) Field of Classification Search ............ None
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 6,664,022 B1 | 12/2003 | Cameron et al. | |
| 7,323,287 B2 | 1/2008 | Iwai et al. | |
| 2005/0266336 A1* | 12/2005 | Kodama ............ | 430/270.1 |
| 2006/0008736 A1* | 1/2006 | Kanda et al. ......... | 430/270.1 |
| 2007/0148595 A1* | 6/2007 | Kanda ............ | 430/270.1 |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-5374 A | 1/2003 |
| JP | 2003-241385 | 8/2003 |
| JP | 2005-37888 A | 2/2005 |
| JP | 2006-119436 A | 5/2006 |
| WO | WO 02/19033 A2 | 3/2002 |
| WO | WO 2004/074242 A2 | 9/2004 |
| WO | WO 2005/003861 A1 | 1/2005 |

OTHER PUBLICATIONS

Derwent English abstract for JP2005-37888 (Hada et al) (2005).*
Machine-assisted English translation of JP2005-37888 (Hada et al), as provided by JPO (2005).*
The International Search Report corresponding to International Application No. PCT/JP2007/060253, (2007).

* cited by examiner

*Primary Examiner* — Sin J. Lee
(74) *Attorney, Agent, or Firm* — Knobbe Martens Olson & Bear LLP

(57) ABSTRACT

A positive resist composition including a resin component (A) which exhibits increased alkali solubility under action of acid and an acid-generator component (B) which generates acid upon exposure, the resin component (A) including a structural unit (a1) derived from an acrylate ester having a tertiary alkyl ester-type acid dissociable, dissolution inhibiting group containing an aliphatic monocyclic group and/or an aliphatic branched, tertiary alkyl ester-type acid dissociable, dissolution inhibiting group, and the acid-generator component (B) including an acid generator (B1) having a cation moiety represented by general formula (b'-1) shown below:

[Chemical Formula 1]

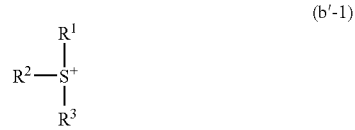

(b'-1)

wherein each of $R^1$ and $R^2$ independently represents a naphthyl group which may have a substituent; and $R^3$ represents an alkyl group or an aryl group exclusive of a naphthyl group.

3 Claims, No Drawings

POSITIVE RESIST COMPOSITION AND METHOD OF FORMING RESIST PATTERN

RELATED APPLICATIONS

This application is the U.S. National Phase filing under 35 U.S.C. §371 of PCT/JP2007/060253, filed May 18, 2007, which designated the United States and was published in a language other than English, which claims priority under 35 U.S.C. §119(a)-(d) to Japanese Patent Application No. 2006-173919 filed Jun. 23, 2006. The contents of these applications are incorporated herein by reference in their entireties.

TECHNICAL FIELD

The present invention relates to a positive resist composition and a method of forming a resist pattern.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film. A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source, Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources. As a resist material which satisfies these conditions, a chemically amplified resist is used, which includes a base resin that exhibits a changed alkali solubility under action of acid and an acid generator that generates acid upon exposure. For example, a chemically amplified positive resist contains, as a base resin, a resin which exhibits increased alkali solubility under action of acid, and an acid generator. In the formation of a resist pattern, when acid is generated from the acid generator upon exposure, the exposed portions become alkali soluble.

Until recently, polyhydroxystyrene (PHS) or derivative resins thereof in which the hydroxyl groups are protected with acid dissociable, dissolution inhibiting groups (PHS-based resins), which exhibit high transparency to a KrF excimer laser (248 nm), have been used as the base resin component of chemically amplified resists. However, because PHS-based resins contain aromatic rings such as benzene rings, their transparency is inadequate for light with wavelengths shorter than 248 nm, such as light of 193 nm. Accordingly, chemically amplified resists that use a PHS-based resin as the base resin component suffer from low levels of resolution in processes that use light of 193 nm.

As a result, resins that contain structural units derived from (meth)acrylate esters within the main chain (acrylic resins) are now widely used as base resins for resists that use ArF excimer laser lithography, as they exhibit excellent transparency in the vicinity of 193 nm. In the case of a positive resist, as the base resin, those which have a structural unit derived from (meth)acrylate ester including an aliphatic polycyclic group-containing, tertiary alkyl ester-type acid dissociable, dissolution inhibiting group, such as a structural unit derived from 2-alkyl-2-adamantyl(meth)acrylate are mainly used (for example, see Patent Document 1).

Here, the term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position. The term "(meth)acrylic acid" is a generic term that includes either or both of acrylic acid having a hydrogen atom bonded to the α-position and methacrylic acid having a methyl group bonded to the α-position.

On the other hand, as acid generators usable in a chemically amplified resist, various types have been proposed including, for example, onium salt-based acid generators such as iodonium salts and sulfonium salts; oxime sulfonate-based acid generators; diazomethane-based acid generators; nitrobenzylsulfonate-based acid generators; iminosulfonate-based acid generators; and disulfone-based acid generators. Currently, as acid generators, those which have triphenylsulfonium (TPS) as the cation moiety and those which have a cation moiety represented by chemical formula shown below are used because they exhibit high acid-generating capability.

[Chemical Formula 1]

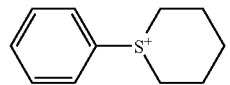

[Patent Document 1] Japanese Unexamined Patent Application, First Publication No. 2003-241385

DISCLOSURE OF INVENTION

Problems to be Solved by the Invention

In recent years, as requirements for high resolution increase with progress in the miniaturization of resist patterns, improvement in various lithography properties has been demanded.

As an example of such lithography properties, line width roughness (hereafter, frequently abbreviated as "LWR") can be mentioned, LWR is a phenomenon in which the line width of a line pattern becomes heterogeneous when a resist pattern is formed using a resist composition, and improvement in the level of LWR becomes an important issue as pattern miniaturization progresses.

However, in the aforementioned conventional positive resist compositions, it was difficult to further reduce LWR.

Further, when a resist pattern is formed on a substrate using a conventional positive resist composition, spreading of the resist pattern at the substrate interface (footing) occurs depending on the type of substrate. As a result, a problem is likely to occur in that the shape of the resist pattern becomes poor, for example, the cross-sectional shape of the resist pattern may develop footing such that the rectangularity of the pattern is lowered. Especially, this problem is likely to occur when a substrate having an inorganic antireflection film (hereafter, frequently referred to as "in organic BARC") is used.

"Inorganic BARCs" refer to antireflection films other than organic antireflection films (hereafter, frequently referred to as "organic BARC"). In an inorganic antireflection film, for example, a silicon material is used, and the inorganic antireflection film includes an antireflection film which exhibits the effect of quenching an acid generator.

"BARC" is an abbreviation of Bottom Anti-Reflection Coating, and refers to a lower layer formed beneath an applied coating layer of a resist composition.

The present invention takes the above circumstances into consideration, with an object of providing a positive resist composition capable of reducing LWR and suppressing development of footing which is likely to occur when a substrate having an inorganic antireflection film (inorganic BARC) formed thereon is used, and a method of forming a resist pattern.

Means to Solve the Problems

For solving the above-mentioned problems, the present inventors propose the following aspects.

Specifically, a first aspect of the present invention is a positive resist composition including a resin component (A) which exhibits increased alkali solubility under action of acid and an acid-generator component (B) which generates acid upon exposure, the resin component (A) including a structural unit (a1) derived from an acrylate ester having a tertiary alkyl ester-type acid dissociable, dissolution inhibiting group containing an aliphatic monocyclic group and/or an aliphatic branched, tertiary alkyl ester-type acid dissociable, dissolution inhibiting group, and the acid-generator component (B) including an acid generator (B1) having a cation moiety represented by general formula (b'-1) shown below,

[Chemical Formula 2]

wherein each of $R^1$ and $R^2$ independently represents a naphthyl group which may have a substituent; and $R^3$ represents an alkyl group or an aryl group exclusive of a naphthyl group.

Further, a second aspect of the present invention is a method of forming a resist pattern, including: applying a positive resist composition of the first aspect to a substrate to form a resist film on the substrate; conducting exposure of the resist film; and developing the resist film to form a resist pattern.

In the present description and claims, the term "structural unit" refers to a monomer unit that contributes to the formation of a resin component (polymer).

The term "exposure" is used as a general concept that includes irradiation with any form of radiation.

An "alkyl group" includes linear, branched or cyclic, monovalent saturated hydrocarbon, unless otherwise specified.

A "lower alkyl group" is an alkyl group of 1 to 5 carbon atoms.

Effect of the Invention

According to the present invention, there are provided a positive resist composition capable of reducing LWR and suppressing development of footing which is likely to occur when a substrate having an inorganic antireflection film (inorganic BARC) formed thereon is used, and a method of forming a resist pattern.

BEST MODE FOR CARRYING OUT THE INVENTION

<<Positive Resist Composition>>

The resist composition of the first aspect of the present invention includes a resin component (A) (hereafter, frequently referred to as "component (A)") which exhibits increased alkali solubility under action of acid and an acid-generator component (B) (hereafter, frequently referred to as "component (B)") which generates acid upon exposure.

In the positive resist composition of the present invention, the component (A) is alkali insoluble prior to exposures. When acid generated from the component (B) upon exposure acts on the component (A), organic groups within the component (A) are dissociated. As a result, the alkali solubility of the entire component (A) is increased, and hence, the component (A) changes from an alkali-insoluble state to an alkali-soluble state. Therefore, in the formation of a resist pattern, by conducting selective exposure of a resist film formed by using the positive resist composition of the present invention, the exposed portions become alkali soluble, whereas the unexposed portions remain alkali insoluble, and hence, a resist pattern can be formed by alkali developing. Here, an "organic group" refers to a group containing a carbon atom, and may contain an atom other than a carbon atom (e.g., a hydrogen atom, an oxygen atom, a nitrogen atom, a sulfur atom, or a halogen atom (a fluorine atom, a chlorine atom, or the like)).

<Component (A)>

In the present invention, the component (A) includes a structural unit (a1) derived from an acrylate ester having a tertiary alkyl ester-type acid dissociable, dissolution inhibiting group containing an aliphatic monocyclic group and/or an aliphatic branched, tertiary alkyl ester-type acid dissociable, dissolution inhibiting group. By using the structural unit (a1) in combination with the aforementioned acid generator (B1), line width roughness (LWR) can be reduced. Also, an excellent effect of suppressing development of footing can be achieved which is likely to occur when a substrate having an inorganic antireflection film (inorganic BARC) formed thereon is used.

In the present descriptions and claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom, or a group) bonded to the carbon atom on the α-position. As the substituent, a halogen atom, a lower alkyl group or a halogenated lower alkyl group can be mentioned. Examples of the halogen atom include a fluorine atom, a chlorine atom, a bromine atom and an iodine atom, and a fluorine atom is particularly desirable.

With respect to the "structural unit derived from an acrylate ester", the "α-position (the carbon atom on the α-position)" refers to the carbon atom having the carbonyl group bonded thereto, unless specified otherwise.

With respect to the acrylate ester, specific examples of the lower alkyl group for the substituent at the α-position include linear or branched alkyl groups such as a methyl group, ethyl group, propyl group, isopropyl group, n-butyl group, isobutyl group, tert-butyl group, pentyl group, isopentyl group, and neopentyl group.

In the present invention, it is preferable that a hydrogen atom, a halogen atom, a lower alkyl group or a halogenated lower alkyl group is bonded to the α-position of the acrylate ester, more preferably a hydrogen atom, a fluorine atom, a lower alkyl group or a fluorinated lower alkyl group. In terms of industrial availability, a hydrogen atom or a methyl group is particularly desirable.

Structural Unit (a1)

In the present invention, the structural unit (a1) is a structural unit derived from an acrylate ester having a tertiary alkyl ester-type acid dissociable, dissolution inhibiting group containing an aliphatic monocyclic group and/or an aliphatic branched, tertiary alkyl ester-type acid dissociable, dissolution inhibiting group.

The tertiary alkyl ester-type acid dissociable, dissolution inhibiting group within the structural unit (a1) exhibits an alkali-dissolution inhibiting effect to render the entire component (A) alkali insoluble prior to dissociation, and changes the entire component (A) to an alkali soluble state following dissociation.

The tertiary alkyl ester-type acid dissociable, dissolution inhibiting group is a group that forms either a monocyclic or chain-like tertiary alkyl ester with the carboxyl group of (meth)acrylic acid (or a derivative thereof), and any tertiary alkyl ester-type acid dissociable, dissolution inhibiting groups containing an aliphatic monocyclic group and aliphatic branched, tertiary alkyl ester-type acid dissociable, dissolution inhibiting groups proposed for a base resin of a chemically amplified resist can be used.

Here, a "tertiary alkyl ester" describes a structure in which an ester is formed by substituting the hydrogen atom of the carboxyl group with a monocyclic or chain-like tertiary alkyl group, and the tertiary carbon atom within the monocyclic or chain-like tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The monocyclic or chain-like alkyl group may have a substituent.

Further, a "tertiary alkyl ester-type acid dissociable, dissolution inhibiting group" refers to a group that exhibit acid dissociability as a result of the formation of a tertiary alkyl ester with the carboxyl group.

In the present invention, a tertiary alkyl ester-type acid dissociable, dissolution inhibiting group refers to a tertiary alkyl ester-type acid dissociable, dissolution inhibiting group containing an aliphatic monocyclic group and/or an aliphatic branched, tertiary alkyl ester-type acid dissociable, dissolution inhibiting group.

In consideration of the effects of the present invention, it is preferable that the tertiary alkyl ester-type acid dissociable, dissolution inhibiting group does not include an acid dissociable, dissolution inhibiting group containing an aliphatic polycyclic group.

In the present description and claims, the term "aliphatic" is a relative concept used in relation to the term "aromatic", and defines a group or compound that has no aromaticity.

The term "aliphatic branched" refers to a branched structure having no aromaticity.

An "aliphatic branched acid dissociable, dissolution inhibiting group" is not limited to a group consisting of carbon and hydrogen (a hydrocarbon group), but is preferably a hydrocarbon group. The "hydrocarbon group" may be either saturated or unsaturated, but is preferably saturated.

As the aliphatic branched acid dissociable, dissolution inhibiting group, a tertiary alkyl group of 4 to 8 carbon atoms is preferable, and specific examples include a tert-butyl group, tert-amyl group and tert-heptyl group.

The term "aliphatic monocyclic group" refers to a monocyclic group that has no aromaticity.

The "aliphatic monocyclic group" within the structural unit (a1) may or may not have a substituent. Examples of suitable substituent groups include a lower alkyl group of 1 to 5 carbon atoms, a fluorine atom, a fluorinated lower alkyl group of 1 to 5 carbon atoms, and an oxygen atom (=O).

The basic ring structure of the "aliphatic monocyclic group" excluding substituent groups is not limited to groups consisting of carbon and hydrogen (hydrocarbon groups), although a hydrocarbon group is preferable. Furthermore, the "hydrocarbon group" may be either saturated or unsaturated, but is preferably saturated.

Specific examples of the aliphatic monocyclic group include groups in which one or more hydrogen atoms have been removed from a monocycloalkane which may or may not be substituted with a lower alkyl group, a fluorine atom or a fluoroalkyl group. Specific examples of suitable groups include groups in which one or more hydrogen atoms have been removed from a monocycloalkane such as cyclopentane or cyclohexane.

Examples of acid dissociable, dissolution inhibiting groups that contain an aliphatic monocyclic group include groups that contain a tertiary carbon atom within the ring skeleton of a cycloalkyl group, and specific examples include a 1-methyl-1-cyclohexyl group and a 1-ethyl-1-cyclohexyl group. Other possible groups include those that contain an aliphatic monocyclic group such as a cyclohexyl group, and a branched alkylene group that contains a tertiary carbon atom and is bonded to the aliphatic cyclic group, such as the group bonded to the oxygen atom of the carbonyloxy group (—C(O)—O—) shown within the structural unit represented by a general formula (a1″) shown below.

[Chemical Formula 3]

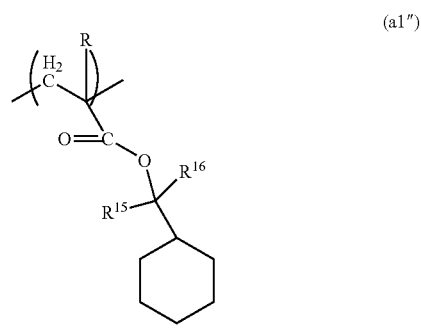

(a1″)

wherein R represents a hydrogen atom, a halogen atom, a lower alkyl group or a halogenated lower alkyl group; and $R^{15}$ and $R^{16}$ represent alkyl groups (which may be either linear or branched groups, and preferably have 1 to 5 carbon atoms).

In general formula (a1″), as the halogen atom, lower alkyl group and halogenated lower alkyl group for R, the same halogen atom, lower alkyl group and halogenated lower alkyl group as those which may be bonded to the α-position of the aforementioned acrylate ester can be mentioned.

As the structural unit (a1), it is preferable to use at least one member selected from the group consisting of structural units represented by formula (a1-0-1) shown below and structural units represented by formula (a1-0-2) shown below.

[Chemical Formula 4]

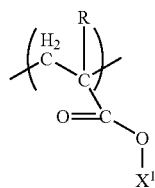

(a1-0-1)

wherein R represents a hydrogen atom, a halogen atom, a lower alkyl group or a halogenated lower alkyl group; and $X^1$ represents a tertiary alkyl ester-type acid dissociable, dissolution inhibiting group containing an aliphatic monocyclic group or an aliphatic branched, tertiary alkyl ester-type acid dissociable, dissolution inhibiting group.

[Chemical Formula 5]

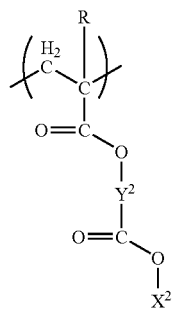

(a1-0-2)

wherein R represents a hydrogen atom, a halogen atom, a lower alkyl group or a halogenated lower alkyl group; $X^2$ represents a tertiary alkyl ester-type acid dissociable, dissolution inhibiting group containing an aliphatic monocyclic group or an aliphatic branched, tertiary alkyl ester-type acid dissociable, dissolution inhibiting group; and $Y^2$ represents an alkylene group or an aliphatic cyclic group.

In general formula (a1-0-1) shown above, the halogen atom, lower alkyl group and halogenated lower all group for R are the same halogen atom, lower alkyl group and halogenated lower alkyl group as those which can be bonded to the α-position of the aforementioned acrylate ester.

$X^1$ is not particularly limited as long as it is a tertiary alkyl ester-type acid dissociable, dissolution inhibiting group containing an aliphatic monocyclic group or an aliphatic branched, tertiary alkyl ester-type acid dissociable, dissolution inhibiting group. Examples thereof include the aforementioned acid dissociable, dissolution inhibiting groups containing an aliphatic monocyclic group and the aforementioned aliphatic branched acid dissociable, dissolution inhibiting groups.

In general formula (a1-0-2), R is as defined for R in general formula (a1-0-1) above.

$X^2$ is as defined for $X^1$ in general formula (a1-0-1)

$Y^2$ is preferably an alkylene group of 1 to 4 carbon atoms or a divalent aliphatic cyclic group. As the aliphatic cyclic group, groups in which two hydrogen atoms have been removed therefrom can be used, and the same aliphatic cyclic groups as those mentioned above in connection with the explanation of "aliphatic monocyclic group", and aliphatic polycyclic groups can be used.

As the aliphatic polycyclic groups, groups in which two or more hydrogen atoms have been removed from a polycycloalkane such as a bicycloalkane, tricycloalkane or tetracycloalkane, which may or may not be substituted with a lower alkyl group, a fluorine atom or a fluorinated alkyl group can be mentioned. Specific examples include groups in which two or more hydrogen atoms have been removed from a polycycloalkane such as adamantane, norbornane, isobornane, tricyclodecane or tetracyclododecanec.

Specific examples of the structural unit (a1) include structural units represented by general formulas (a1-1) and (a1-3) shown below.

[Chemical Formula 6]

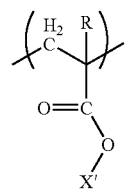

(a1-1)

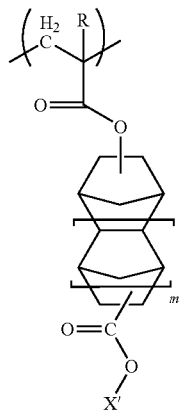

(a1-3)

wherein X' represents a tertiary alkyl ester-type acid dissociable, dissolution inhibiting group containing an aliphatic monocyclic group or an aliphatic branched, tertiary alkyl ester-type acid dissociable, dissolution inhibiting group; m represents 0 or 1; and R is as defined for R in general formula (a1-0-1) above.

In general formulas (a1-1) and (a1-3), R is as defined for R in general formula (a1-0-1) above.

X' is the same as the above-mentioned tertiary alkyl ester-type acid dissociable, dissolution inhibiting group containing an aliphatic monocyclic group or aliphatic branched, tertiary alkyl ester-type acid dissociable, dissolution inhibiting group for $X^1$ m represents 0 or 1.

Specific examples of structural units represented by general formulas (a1-1) and (a1-3) are shown below.

[Chemical Formula 7]
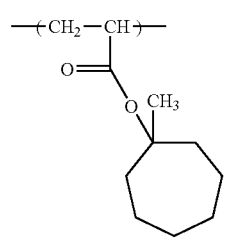 (a1-1-27)
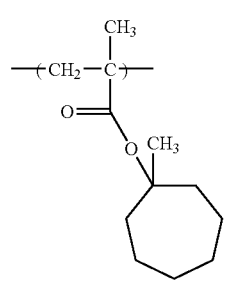 (a1-1-30)
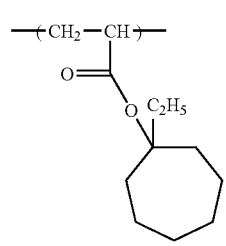 (a1-1-31)
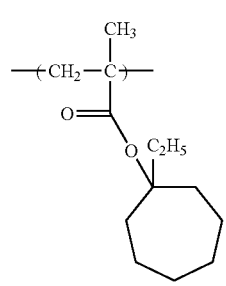 (a1-1-32)
[Chemical Formula 8]
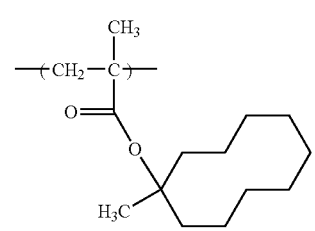 (a1-1-33)
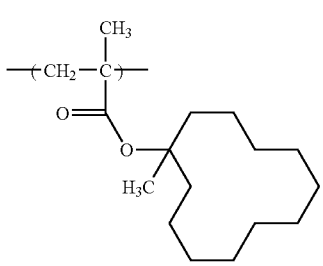 (a1-1-34)
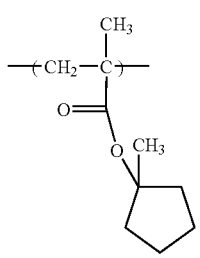 (a1-1-35)
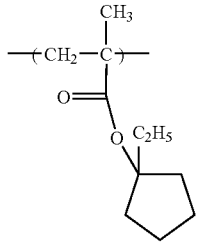 (a1-1-36)
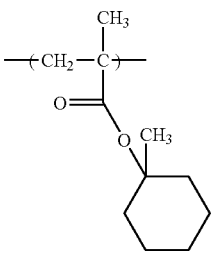 (a1-1-37)
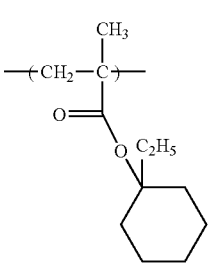 (a1-1-38)
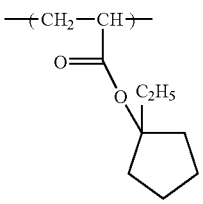 (a1-1-39)
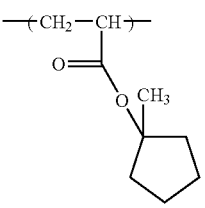 (a1-1-40)
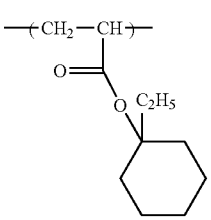 (a1-1-41)

[Chemical Formula 9]
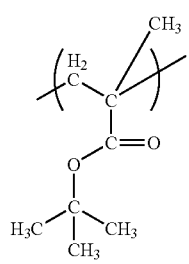 (a1-1-42)
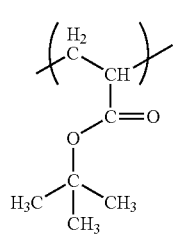 (a1-1-43)
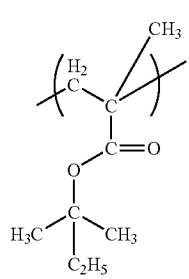 (a1-1-44)
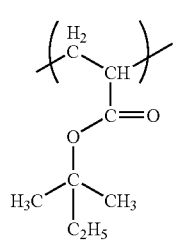 (a1-1-45)
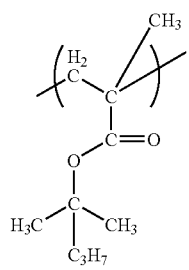 (a1-1-46)
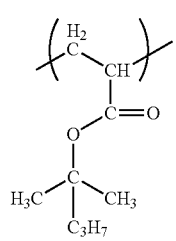 (a1-1-47)
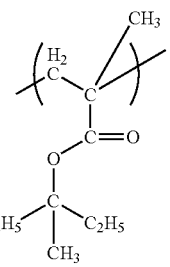 (a1-1-48)
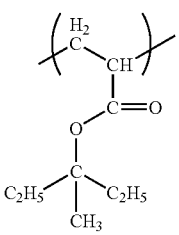 (a1-1-49)
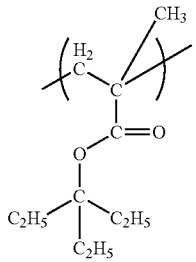 (a1-1-50)
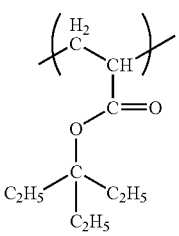 (a1-1-51)
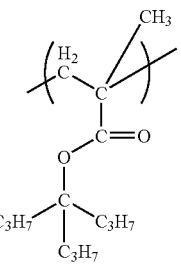 (a1-1-52)
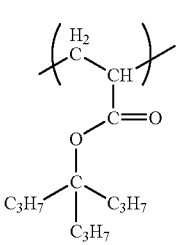 (a1-1-53)

(a1-1-54)
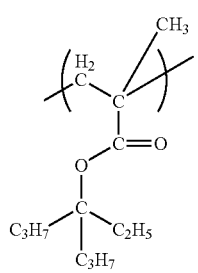
(a1-1-55)
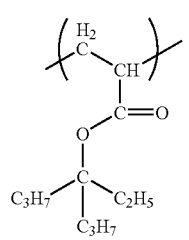
[Chemical Formula 10]
(a1-3-5)
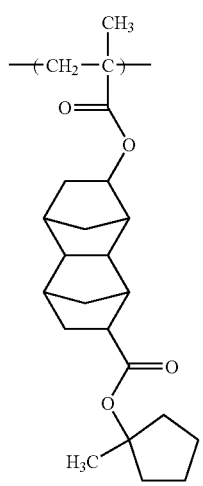
(a1-3-6)
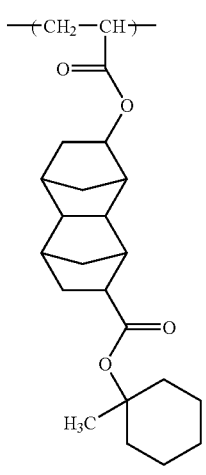
(a1-3-7)
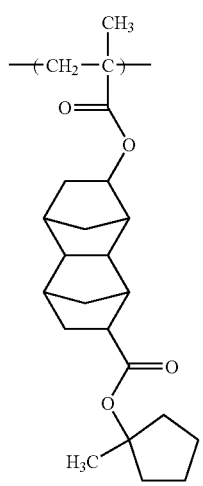
(a1-3-8)
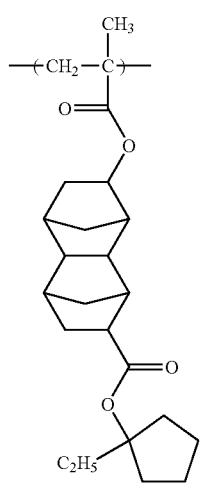
(a1-3-9)
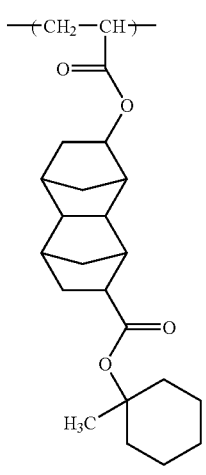

[Chemical Formula 11]
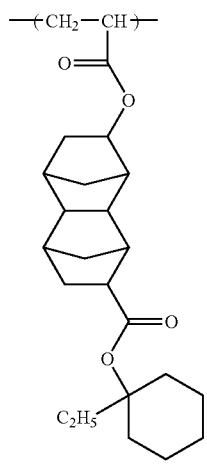 (a1-3-10)
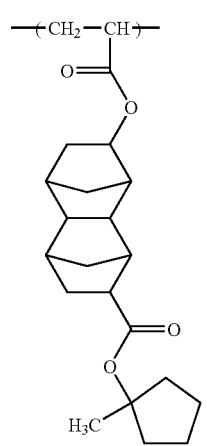 (a1-3-11)
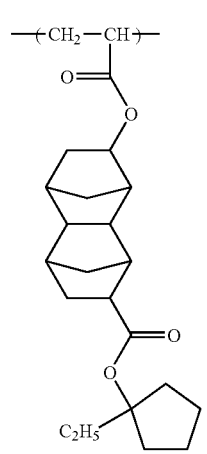 (a1-3-12)
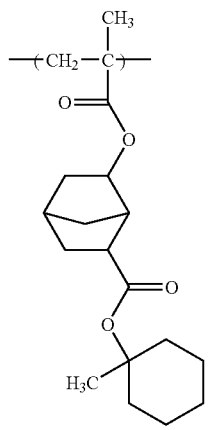 (a1-3-17)
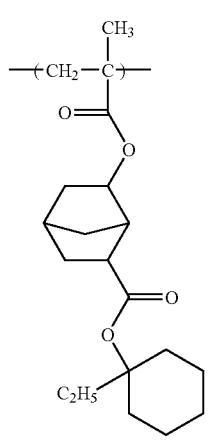 (a1-3-18)
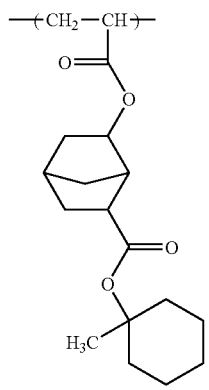 (a1-3-19)
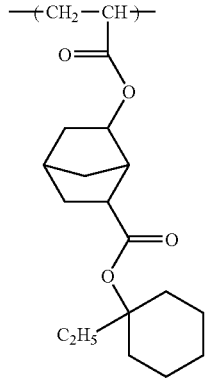 (a1-3-20)

-continued (a1-3-21)
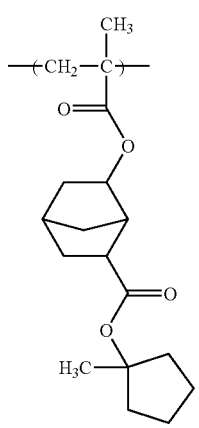

(a1-3-22)
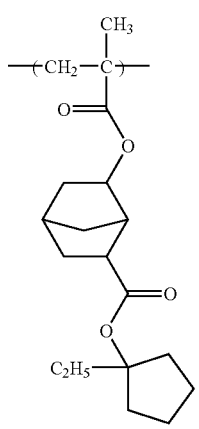

(a1-3-23)
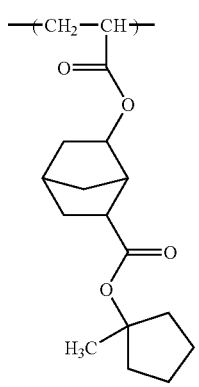

(a1-3-24)
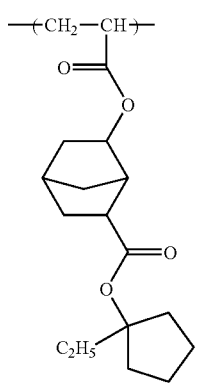

As the structural unit (a1), one type of structural unit may be used alone, or two or more types may be used in combination.

Among these, as a structural unit (a11) derived from an acrylate ester having a tertiary alkyl ester-type acid dissociable, dissolution inhibiting group containing an aliphatic monocyclic group (hereafter, frequently referred to simply as "structural unit (a11)"), a structural unit represented by general formula (a1-1-02) shown below which includes the structural units represented by chemical formulas (a1-1-27), (a1-1-30) to (a1-1-32) and (a1-1-35) to (a1-1-41) are particularly desirable.

Further, as a structural unit (a12) derived from an acrylate ester having an aliphatic branched, tertiary alkyl ester-type acid dissociable, dissolution inhibiting group (hereafter, frequently referred to simply as "structural unit (a12)"), a structural unit represented by general formula (a1-1-03) shown below which includes the structural units represented by chemical formulas (a1-1-42) to (a1-1-55) are particularly desirable.

[Chemical Formula 12]

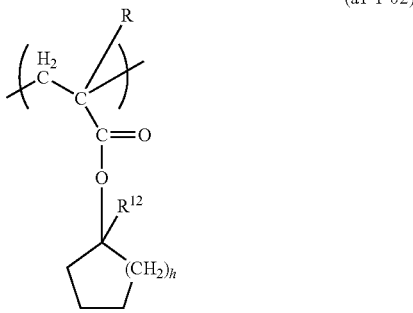

(a1-1-02)

wherein R represents a hydrogen atom, a halogen atom, a lower alkyl group or a halogenated lower alkyl group; $R^{12}$ represents a lower alkyl group; and h represents an integer of 1 to 3.

[Chemical Formula 13]

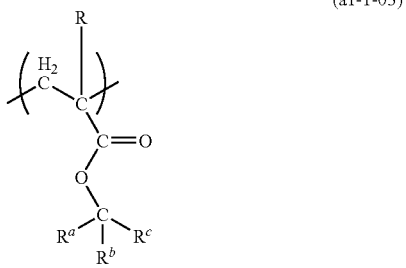

(a1-1-03)

wherein R represents a hydrogen atom, a halogen atom, a lower alkyl group or a halogenated lower alkyl group; and each of $R^a$ to $R^c$ independently represents a lower alkyl group.

In general formula (a1-1-02), R is as defined for R in general formula (a1-0-1) above.

The lower alkyl group for $R^{12}$ is the same as the lower alkyl group for R above. $R^{12}$ is preferably a methyl group or an ethyl group, and most preferably an ethyl group. h is preferably 1 or 2, and most preferably 2.

In general formula (a1-1-03), R is as defined for R in general formula (a1-0-1) above.

The lower alkyl group for $R^a$ to $R^c$ is the same as the lower alkyl group for R above. It is preferable that each of $R^a$ to $R^c$ represents a linear alkyl group or an alkyl group having the same number of carbon atoms, more preferably a linear alkyl group having the same number of carbon atoms, and most preferably a methyl group (tert-butyl group).

In the component (A), the amount of the structural unit (a1) based on the combined total of all structural units constituting the component (A) is preferably 10 to 80 mol %, more preferably 20 to 70 mol %, and still more preferably 25 to 50 mol %. By making the amount of the structural unit (a1) at least as large as the lower limit of the above-mentioned range, a pattern can be easily formed using a resist composition prepared from the component (A). On the other hand, by making the amount of the structural unit (a1) no more than the upper limit of the above-mentioned range, a good balance can be achieved with the other structural units.

In the present invention, the component (A) is a resin (polymer) including the structural unit (a1). As such a resin, a resin including the structural unit (a11) and a resin including the structural unit (a12) can be mentioned.

As the component (A), one type of resin may be used alone, or two or more types of resins may be used in combination.

It is preferable that the component (A) contain a resin (A1) including the structural unit (a11) and a resin (A2) including the structural unit (a12). By including the resin (A1) and the resin (A2), lithography properties, especially the effect of reducing line width roughness (LWR) can be improved.

[Resin (A1)]

In the present invention, the resin (A1) includes the structural unit (a11).

It is preferable that the resin (A1) further include a structural unit (a2) derived from an acrylate ester containing a lactone-containing cyclic group.

Moreover, it is preferable that the resin (A1) further include a structural unit (a3) derived from an acrylate ester containing a polar group-containing aliphatic hydrocarbon group.

Structural Unit (a11)

In the present invention, by virtue of the resin (A1) including the structural unit (a11), the effect of reducing LWR can be improved. Further, PEB margin is also improved.

In the resin (A1), as the structural unit (a11), one type of structural unit may be used alone, or two or more types may be used in combination.

In the resin (A1), the amount of the structural unit (a11) based on the combined total of all structural units constituting the resin (A1) is preferably 10 to 80 mol %, more preferably 20 to 70 mol %, still more preferably 25 to 50 mol %, and most preferably 30 to 50 mol %. By making the amount of the structural unit (a11) at least as large as the lower limit of the above-mentioned range, the effect of including the structural unit (a11) can be satisfactorily achieved, and a pattern can be easily formed using a resist composition prepared from the resin (A1). On the other hand, by making the amount of the structural unit (a11) no more than the upper limit of the above-mentioned range, a good balance can be achieved with the other structural units.

Structural Unit (a2)

In the present invention, the structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the resin (A1) is used for forming a resist film, the lactone-containing cyclic group of the structural unit (a2) is effective in improving the adhesion between the resist film and the substrate, and increasing the compatibility with a developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below,

[Chemical Formula 14]

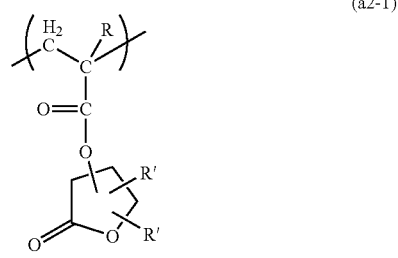

(a2-1)

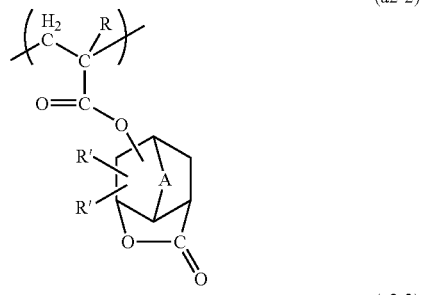

(a2-2)

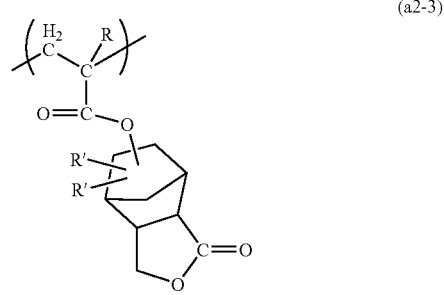

(a2-3)

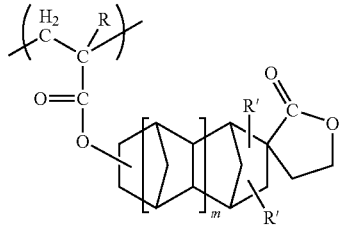

(a2-4)

(a2-5)

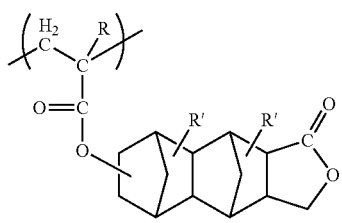

wherein R represents a hydrogen atom, a halogen atom, a lower alkyl group or a halogenated lower alkyl group; R' represents a hydrogen atom, a lower alkyl group or an alkoxy group of 1 to 5 carbon atoms; m represents 0 or 1; and A represents an alkylene group of 1 to 5 carbon atoms or an oxygen atom.

In general formulas (a2-1) to (a2-5), R is as defined for R in general formula (a1-0-1) for the structural unit (a1).

The lower alkyl group for R' is the same as the lower alkyl group for R in general formula (a1-0-1) for the structural unit (a1).

Specific examples of alkylene groups of 1 to 5 carbon atoms for A include a methylene group, ethylene group, n-propylene group and isopropylene group.

In the structural units represented by general formulas (a2-1) to (a2-5), in consideration of industrial availability, R' is preferably a hydrogen atom.

Specific examples of structural units represented by general formulas (a2-1) to (a2-5) above are shown below,

[Chemical Formula 15]

(a2-1-1)

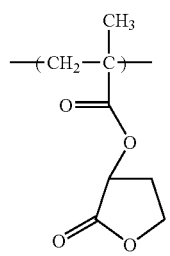

(a2-1-2)

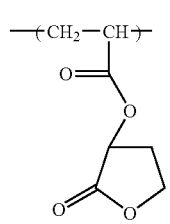

(a2-1-3)

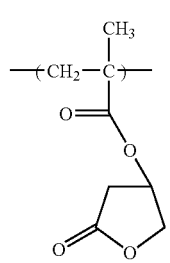

(a2-1-4)

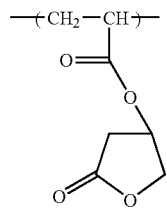

(a2-1-5)

(a2-1-6)

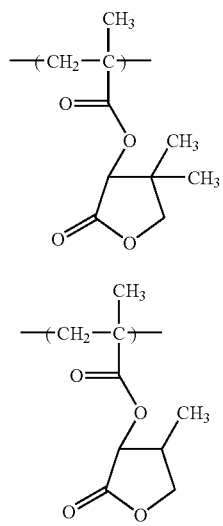

[Chemical Formula 16]

(a2-2-1)

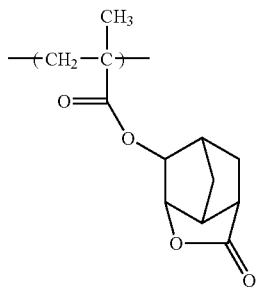

(a2-2-2)

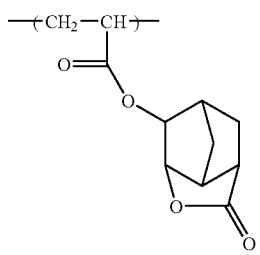

(a2-2-3)

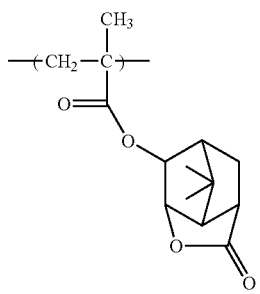

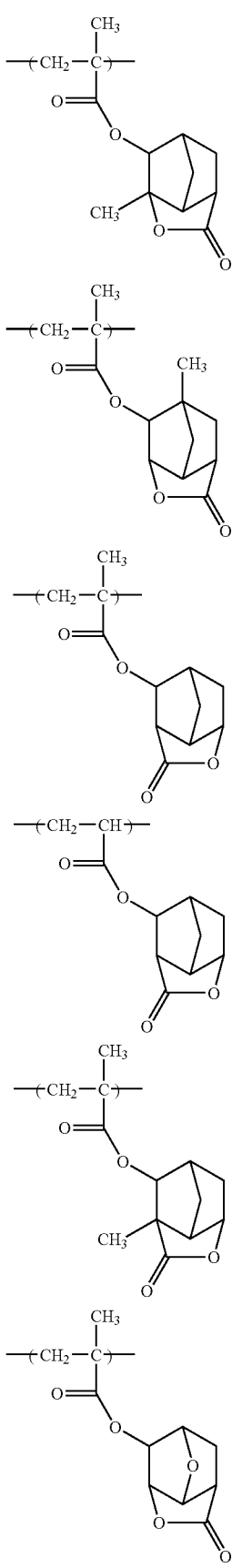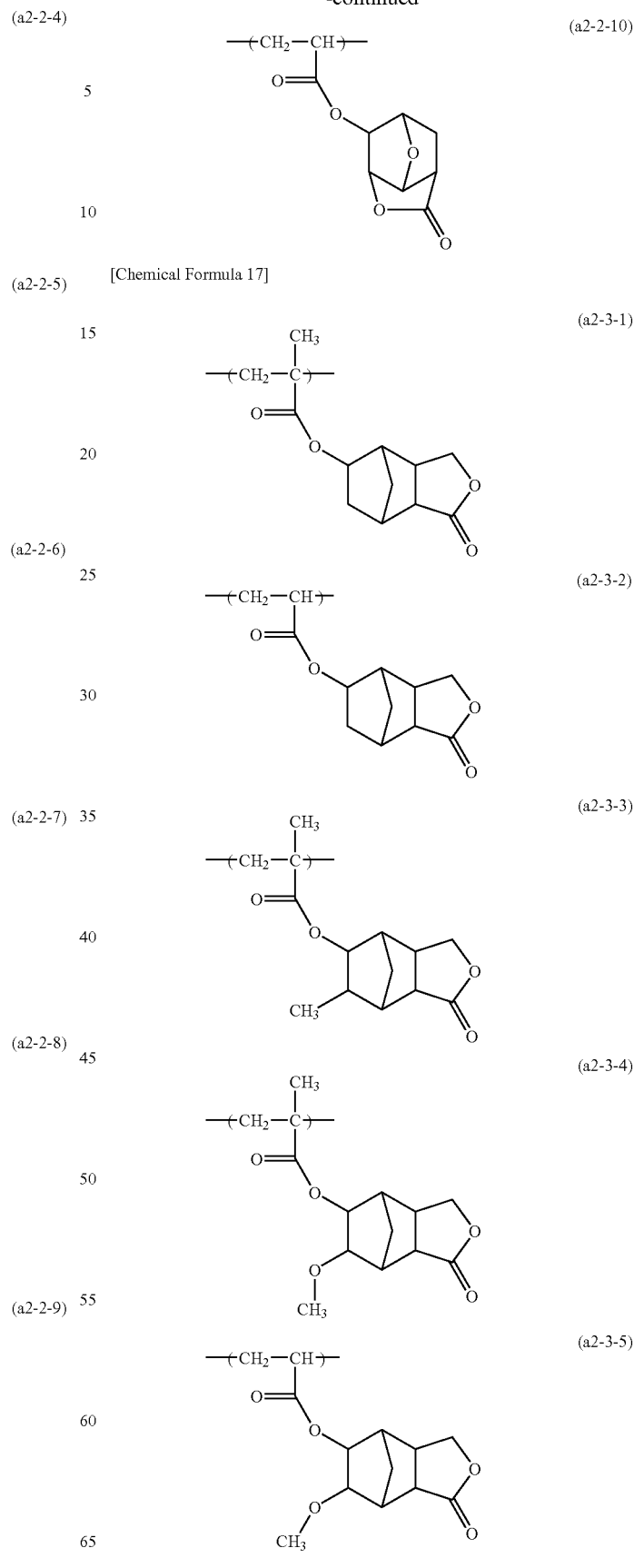

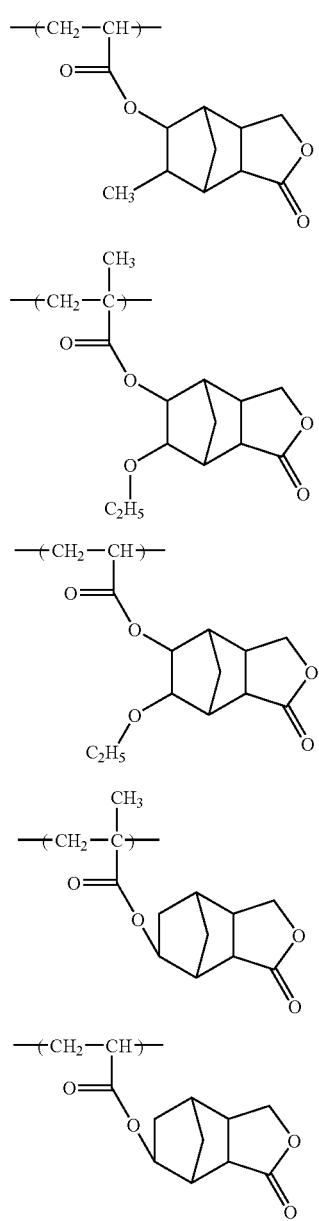
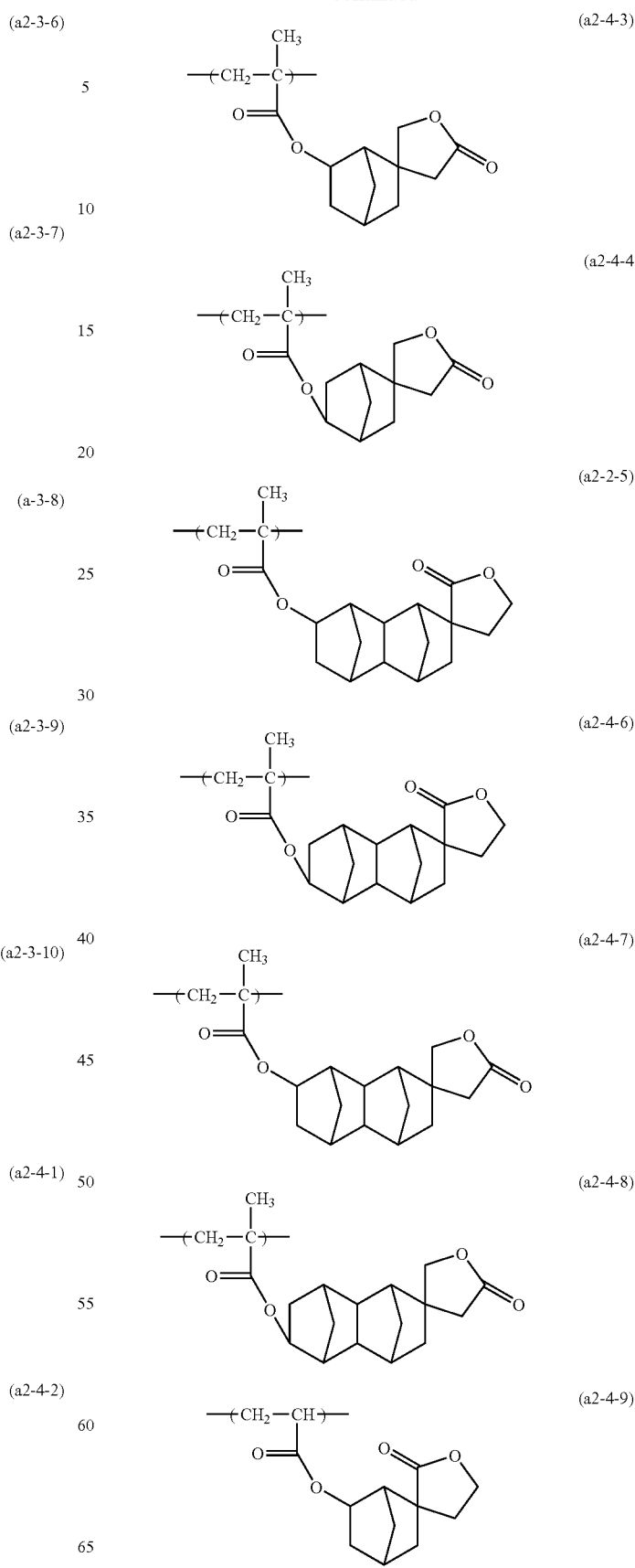

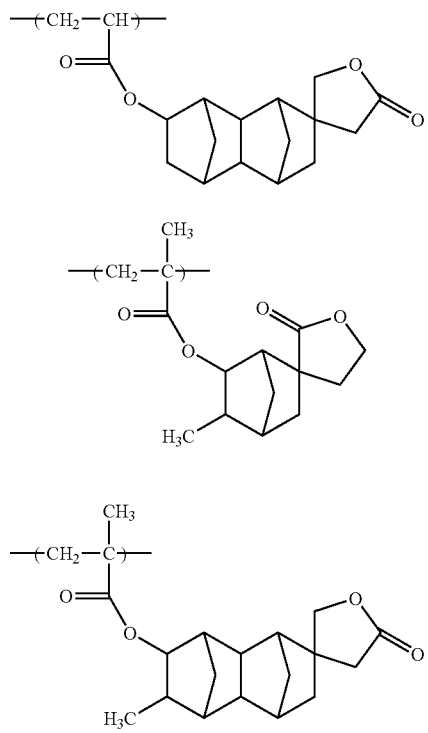

(a2-4-10)

(a2-4-11)

(a2-4-12)

[Chemical Formula 19]

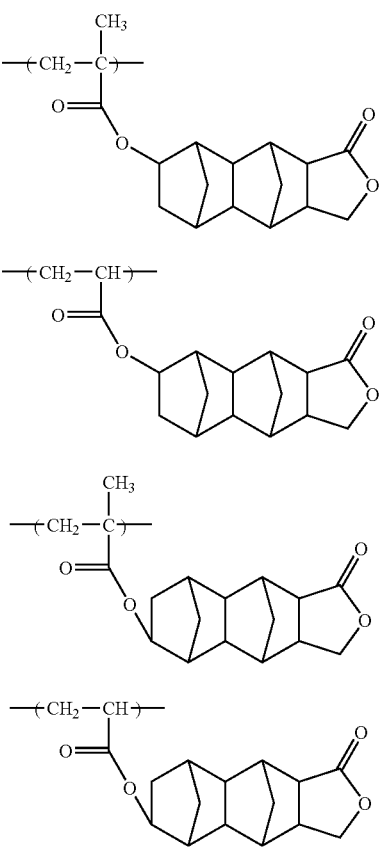

(a2-5-1)

(a2-5-2)

(a2-5-3)

(a2-5-4)

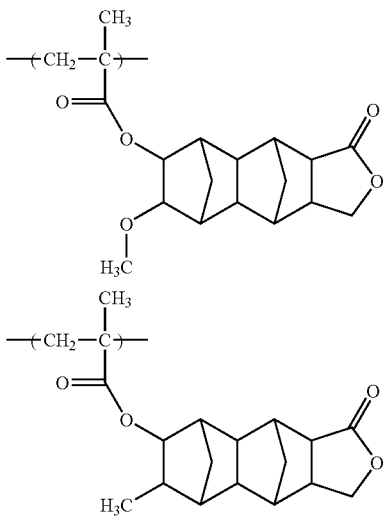

(a2-5-5)

(a2-5-6)

Of these, at least one structural unit selected from the group consisting of formulas (a2-1) to (a2-5) is preferable, and at least one structural unit selected from the group consisting of formulas (a2-1) to (a2-3) is more preferable. Specifically, it is preferable to use at least one structural unit selected from the group consisting of formulas (a2-1-1), (a2-1-2), (a2-2-1), (a2-2-2), (a23231), (a2-3-2), (a2-3-9) and (a2-3-10).

In the resin (A1), as the structural unit (a2), one type of structural unit may be used, or two or more types may be used in combination.

In the resin (A1), the amount of the structural unit (a2) based on the combined total of all structural units constituting the resin (A1) is preferably 5 to 60 mol %, more preferably 10 to 50 mol %, and still more preferably 20 to 50 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

Structural Unit (a3)

In the present invention, the structural unit (a3) is a structural unit derived from an acrylate ester containing a polar group-containing aliphatic hydrocarbon group.

In the present invention, when the resin (A1) includes the structural unit (a3), the hydrophilicity of the resin (A1) is improved, and hence, the compatibility of the resin (A1) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which a part of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers.

Of the various possibilities, structural units derived from an acrylate ester that include an aliphatic polycyclic group that contains a hydroxyl group, cyano group, carboxyl group or a hydroxyalkyl group in which a part of the hydrogen atoms of the alkyl group have been substituted with fluorine atoms are particularly desirable. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2), and (a3-3) shown below are preferable.

[Chemical Formula 20]

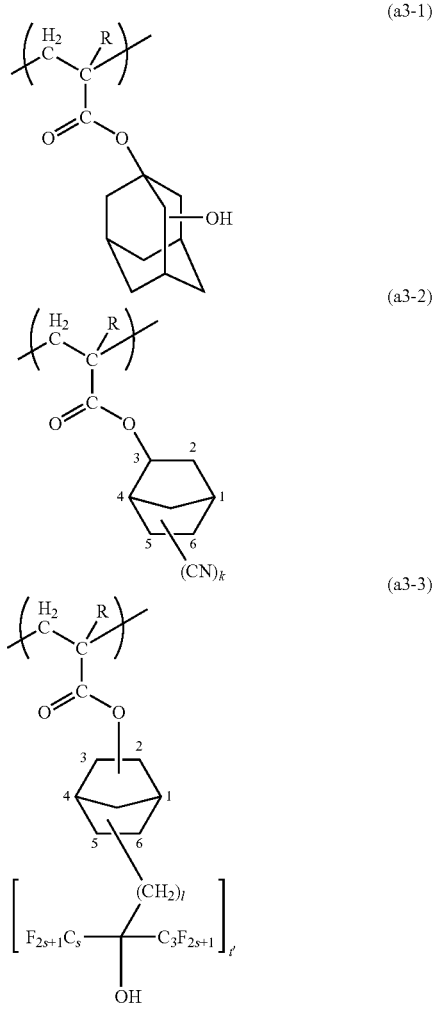

wherein R is as defined for R in general formula (a1-0-1) above; j is an integer of 1 to 3; k is an integer of 1 to 3; t' is an integer of 1 to 3; 1 is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbonyl group.

In formula (a3-3), t' is preferably 1, l is preferably 1 and s is preferably 1. Further, in formula (a3-3), it is preferable that a 2-norbonyl group or 3-norbonyl group be bonded to the terminal of the carboxy group of acrylic acid. The fluorinated alkyl alcohol is preferably bonded to the 5th or 6th position of the norbonyl group.

In the resin (A1), as the structural unit (a3), one type of structural unit may be used, or two or more types may be used in combination.

In the resin (A1), the amount of structural unit (a3) based on the combined total of all structural units constituting the resin (A1) is preferably 5 to 50 mol %, more preferably 5 to 40 mol %, and still more preferably 5 to 25 mol %. By making the amount of the structural unit (a3) at least as large as the lower limit of the above-mentioned range, the effect of using the structural unit (a3) can be satisfactorily achieved. On the other hand, by making the amount of the structural unit (a3) no more than the upper limit of the above-mentioned range, a good balance can be achieved with the other structural units.

Structural Unit (a4)

The resin (A1) may also include a structural unit (a4) which is other than the above-mentioned structural units (a1) to (a3), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyolic group include groups in which one or more hydrogen atoms have been removed from the aliphatic polycyclic groups (polycycloalkanes) mentioned above for $Y^2$ in general formula (a1-0-2) which was described in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a-4-1) to (a-4-5) shown below.

[Chemical Formula 21]

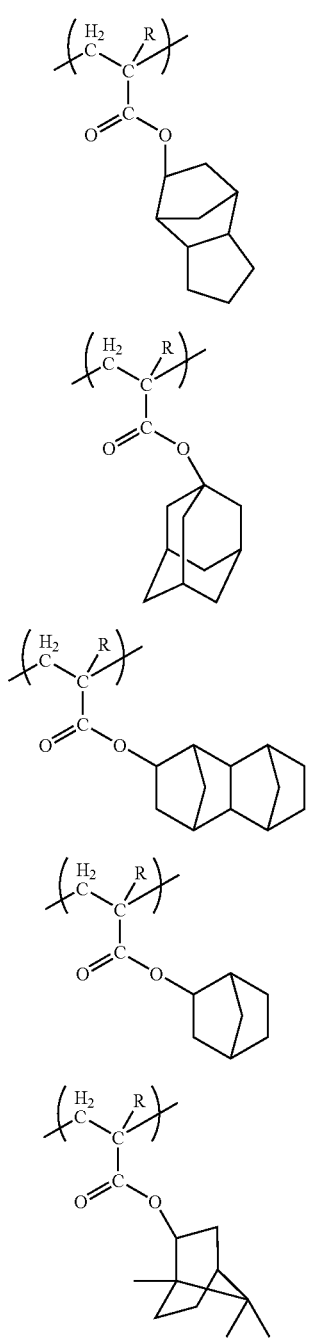

wherein R is as defined for R in general formula (a1-0-1) above,

When the structural unit (a4) is included in the resin (A1), the amount of the structural unit (a4) based on the combined total of all the structural units that constitute the resin (A1) is preferably within the range from 1 to 30 mol %, and more preferably from 10 to 20 mmol %.

In the present invention, the resin (A1) is a copolymer having the structural unit (a11) and preferably the structural unit (a2) and/or the structural unit (a3). Examples of such a copolymer include a copolymer consisting of the structural units (a11), (a2) and (a3), and a copolymer consisting of the structural units (a11), (a2), (a3) and (a4).

In the component (A), as the resin (A1), one type of resin may be used alone, or two or more types may be used in combination.

In the present invention, as the resin (A1), a copolymer having a specific combination of structural units as shown below is particularly desirable.

[Chemical Formula 22]

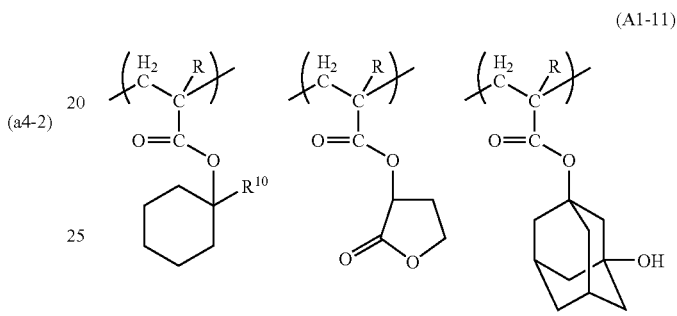

wherein R is as defined for R in general formula (a1-0-1) above; and $R^{10}$ represents a lower alkyl group.

In formula (A1-11), R is preferably a hydrogen atom or a methyl group, and it is particularly desirable that each R represents a methyl group.

In formula (A1-11), the lower alkyl group for $R^{10}$ is the same as the lower alkyl group for A, preferably a methyl group or an ethyl group, and most preferably an ethyl group.

The weight average molecular weight (Mw) (the polystyrene equivalent value determined by gel permeation chromatography) of the resin (A1) is not particularly limited, but is preferably 2,000 to 50,000, more preferably 3,000 to 30,000, and most preferably 5,000 to 20,000. By making the weight average molecular weight no more than the upper limit of the above-mentioned range, the resin (A1) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

[Resin (A2)]

In the present invention, the resin (A2) includes the structural unit (a12).

It is preferable that the resin (A2) further include the aforementioned structural unit (a2). Moreover, it is preferable that the resin (A2) further include the aforementioned structural unit (a3).

Structural Unit (a12)

In the present invention, by virtue of including the structural unit (a12), resolution and the shape of the resist pattern can be improved. Especially, the aforementioned effects can be achieved in an isolated line resist pattern.

In the resin (A2), as the structural unit (a12), one type of structural unit may be used alone, or two or more types may be used in combination.

In the resin (A2), the amount of the structural unit (a12) based on the combined total of all structural units constituting the resin (A2) is preferably 10 to 80 mol %, more preferably 20 to 70 mol %, still more preferably 25 to 50 mol %, and most preferably 30 to 45 mol %. By making the amount of the structural unit (a12) at least as large as the lower limit of the above-mentioned range, the effect of including the structural unit (a12) can be satisfactorily achieved, and a pattern can be easily formed using a resist composition prepared from the resin (A2). On the other hand, by making the amount of the structural unit (a12) no more than the upper limit of the above-mentioned range, a good balance can be achieved with the other structural units.

The structural units (a2), (a3) and (a4) for the resin (A2) are respectively the same as the structural units (22), (a3) and (a4) mentioned above for the resin (A1).

In the resin (A2), with respect to the amounts of the respective structural units based on the combined total of all structural units constituting the resin (A2), the amount of structural unit (a2) is preferably 5 to 60 mol %, more preferably 10 to 50 mol %, and still more preferably 20 to 50 mol %, and the amount of the structural unit (a3) is preferably 5 to 50 mol %, more preferably 5 to 40 mol %, and still more preferably 5 to 25 mol %.

When the structural unit (a4) is included in the resin (A2), the amount of the structural unit (a4) is preferably within the range from 1 to 30 mol %, and more preferably from 10 to 20 mol %.

By making the amounts of the respective structural units within the above-mentioned range, the effects of including the respective structural units can be satisfactorily achieved, and a good balance can be achieved with the other structural units.

In the present invention, the resin (AM) is a copolymer having the structural unit (a12) and preferably the structural unit (a2) and/or the structural unit (a3). Examples of such a copolymer include a copolymer consisting of the structural units (a12), (a) and (a3), and a copolymer consisting of the structural units (a12), (a2), (a3) and (a4).

In the component (A), as the resin (A1), one type of resin may be used alone, or two or more types may be used in combination.

In the present invention, as the resin (A2), a copolymer having a specific combination of structural units as shown below is particularly desirable.

[Chemical Formula 23]

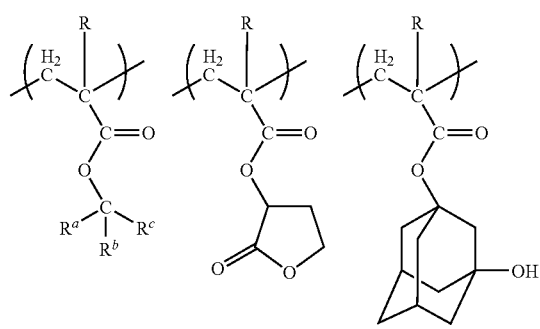

(A2-11)

wherein R is as defined for R in general formula (a1-0-1) above; and $R^a$ to $R^c$ are as defined for $R^a$ to $R^c$ in general formula (a1-1-03) above.

In formula (A2-11), R is preferably a hydrogen atom or a methyl group, and it is particularly desirable that each R represents a methyl group.

In formula (A2-11), $R^a$ to $R^c$ are the same as the lower alkyl group for R, and are preferably linear alkyl groups having the same number of carbon atoms, and it is particularly desirable that each of $R^a$ to $R^c$ be a methyl group (tert-butyl group).

The weight average molecular weight (Mw) (the polystyrene equivalent value determined by gel permeation chromatography) of the resin (A2) is not particularly limited, but is preferably 2,000 to 50,000, more preferably 3,000 to 30,000, and most preferably 5,000 to 20,000. By making the weight average molecular weight no more than the upper limit of the above-mentioned range, the resin (A2) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5.

In the present invention, in consideration of the effects of the present invention (especially the effect of reducing LWR), the mixing ratio of the resin (A1) to the resin (A2) in terms of weight ratio is preferably 90:10 to 10:90, more preferably 75:25 to 25:75, and most preferably 60:40 to 40:60.

The component (A) can be obtained, for example, by a conventional radical polymerization or the like of the monomers corresponding with each of the structural units, using a radical polymerization initiator such as azobisisobutyronitrile (AIBN).

Furthermore, in the component (A), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which a part of the hydrogen atoms of the alkyl group are substituted with fluorine atoms is effective in reducing developing defects and LER (line edge roughness: unevenness of the side walls of a line pattern).

When the component (A) is a mixture, for example, each of the polymers can be synthesized by polymerizing the monomers corresponding with each of the structural units, and the polymers can be mixed together to obtain the component (A).

The weight average molecular weight (Mw) (the polystyrene equivalent value determined by gel permeation chromatography) of the entire component (A) is not particularly limited, but is preferably 2,000 to 50,000, more preferably 3,000 to 30,000, and most preferably 5,000 to 20,000. By making the weight average molecular weight no more than the upper limit of the above-mentioned range, the component (A) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the resist composition of the present invention, the amount of the component (A) can be appropriately adjusted depending on the thickness of the resist film to be formed, and the like.

<Component (B)>

In the positive resist composition of the present invention, the component (B) includes an acid generator (B1) (hereafter, referred to as "component (B1)") having a cation moiety represented by general formula (b'-1) above. By using the component (B1) in combination with the aforementioned structural unit (A1), not only can line width roughness (LWR) be reduced, but also an excellent effect of suppressing development of footing can be achieved which is likely to occur when a substrate having an inorganic antireflection film (inorganic BARC) formed thereon is used. Further, the component (B1) can be blended in the positive resist composition in a large amount. It is presumed that this is due to the high transparency (suppression of photoabsorption) in the exposure wavelength range (especially in the wavelength band of ArF excimer laser).

In general formula b'-1) above, each of $R^1$ and $R^2$ independently represents a naphthyl group which may have a substituent.

The naphthyl group may or may not have a part or all of the hydrogen atoms substituted with alkyl groups, alkoxy groups, halogen atoms, or the like.

The alkyl group with which hydrogen atoms of the naphthyl group may be substituted is preferably an alkyl group having 1 to 5 carbon atoms, and more preferably a methyl group, an ethyl group, a propyl group, an n-butyl group, or a tert-butyl group.

The alkoxy group with which hydrogen atoms of the naphthyl group may be substituted is preferably an alkoxy group having 1 to 5 carbon atoms, and more preferably a methoxy group or an ethoxy group.

The halogen atom with which hydrogen atoms of the naphthyl group may be substituted is preferably a fluorine atom.

It is particularly desirable that each of $R^1$ and $R^2$ be a naphthyl group having no substituent.

$R^3$ represents an alkyl group or an aryl group exclusive of a naphthyl group.

The alkyl group for $R^3$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl groups an n-pentyl group, a cyclopentyl group, a hexyl group, a cyclohexyl group, a nonyl group, and a decanyl group, and a methyl group is most preferable because it is excellent in resolution and can be synthesized at a low cost.

The aryl group for $R^3$ is not particularly limited, as long as it is an aryl group other than a naphthyl group. For example, an aryl group (other than a naphthyl group) having 6 to 20 carbon atoms may be used in which a part or all of the hydrogen atoms of the aryl group may or may not be substituted with alkyl groups, alkoxy groups, halogen atoms or the like. The aryl group is preferably an aryl group (other than a naphthyl group) having 6 to 10 carbon atoms because it can be synthesized at a low cost. Specific example thereof includes a phenyl group.

As the alkyl group, alkoxy group and halogen atom with which the hydrogen atoms of the aryl group may be substituted, the same alkyl group, alkoxy group and halogen atom as those described above in connection with $R^1$ and $R^2$ can be mentioned.

It is preferable that $R^3$ be an aryl group (other than a naphthyl group), and it is particularly desirable that $R^3$ be a phenyl group.

The anion moiety for the component (B1) is not particularly limited, and any of those known as an anion moiety for an onium salt-based acid generator can be appropriately used.

For example, an anion moiety represented by general formula: $R^{14}SO_3^-$ (wherein $R^{14}$ represents a linear, branched or cyclic alkyl group or a fluorinated alkyl group), an anion moiety represented by general formula (b-3) shown below, an anion moiety represented by general formula (b-4) shown below, or the like, can be used.

[Chemical Formula 24]

(b-3)

(b-4)

wherein X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

In general formula "$R^{14}SO_3^-$" above, $R^{14}$ represents a linear, branched or cyclic alkyl group or a fluorinated alkyl group.

The linear or branched alkyl group for $R^{14}$ preferably has 1 to 10 carbon atoms, more preferably 1 to 8 carbon atoms, and most preferably 1 to 4 carbon atoms.

The cyclic alkyl group for $R^{14}$ is like the cyclic groups mentioned above for $R^3$ in general formula (b'-1) above, and preferably has 4 to 15 carbon atoms, more preferably 4 to 10 carbon atoms, and most preferably 6 to 10 carbon atoms.

The fluorinated alkyl group for $R^{14}$ preferably has 1 to 10 carbon atoms, more preferably 1 to 8 carbon atoms, and most preferably 1 to 4 carbon atoms. Further, the fluorination ratio of the fluorinated alkyl group (i.e., the percentage of the fluorine atoms within the alkyl group, and the same applies below) is preferably 10 to 100%, more preferably 50 to 100%, and it is particularly desirable that all of the hydrogen atoms are substituted with fluorine atoms, as the acid strength increases.

As $R^{14}$, a linear or cyclic alkyl group, or a fluorinated alkyl group is more preferable.

In general formula (b-3) above, X" represents a linear or branched alkylene group in which at least one hydrogen atom has been substituted with a fluorine atom, and the alkylene group preferably has 2 to 6 carbon atoms, more preferably 3 to 5 carbon atoms, and most preferably 3 carbon atoms.

In general formula (b-4) above, each of Y" and Z" independently represents a linear or branched alkyl group in which at least one hydrogen atom has been substituted with a fluorine atom, and the alkyl group preferably has 1 to 10 carbon atoms, more preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The fluorination ratio the alkylene group or alkyl group is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

As the anion moiety for the component (B1), an anion moiety represented by general formula "$R^{14}SO_3^-$" is preferable, and an anion moiety in which $R^{14}$ is a fluorinated alkyl group is more preferable.

Preferable examples of the component (B1) include di(1-naphthyl)phenylsulfonium trifluoromethanesulfonate, heptafluoropropanesulfonate or nonafluorobutanesulfonate. It is also possible to use onium salts in which the anion moiety of these onium salts are replaced by methanesulfonate, n-propanesulfonate, n-butanesulfonate, or n-octanesulfonate.

Among these, di(1-naphthyl)phenylsulfonium nonafluorobutanesulfonate is particularly desirable.

As the component (B1), one type of acid generator may be used, or two or more types may be used in combination.

In the positive resist composition of the present invention, the amount of the component (B1) based on the entire component (B) is preferably 40% by weight or more, more preferably 70% by weight or more, still more preferably 80% by weight or more, and may be even 100% by weight. When the amount of the component (B1) is at least as large as the lower limit of the above-mentioned range, by virtue of the use of the component (B1) in combination with the structural unit (a1), not only can the effect of reducing LWR can be improved, but also an excellent effect of suppressing development of footing can be achieved which is likely to occur when a substrate having an inorganic antireflection film (inorganic BARC) formed thereon is used.

In the component (B), an acid generator (132) other than the aforementioned component (B1) (hereafter, referred to as "component (B2)") may be used in combination with the component (B1).

As the component (B2), there is no particular limitation as long as it is an acid generator other than the component (B1), and any of the known acid generators used in conventional chemically amplified resist compositions can be used.

Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

Examples of onium salt-based acid generators include compounds represented by general formula (b-0) shown below.

[Chemical Formula 25]

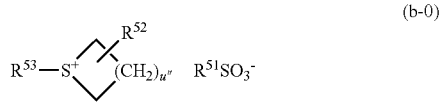

(b-0)

wherein $R^{51}$ represents a linear, branched or cyclic alkyl group, or a linear, branched or cyclic fluorinated alkyl group; $R^{52}$ represents a hydrogen atom, a hydroxyl group, a halogen atom, a linear or branched alkyl group, a linear or branched halogenated alkyl group, or a linear or branched alkoxy group; $R^{53}$ represents an aryl group which may have a substituent; and u" represents an integer of 1 to 3.

In general formula (b-0), $R^{51}$ represents a linear, branched or cyclic alkyl group, or a linear, branched or cyclic fluorinated alkyl group.

The linear or branched alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. The fluorination ratio of the fluorinated alkyl group percentage of the number of fluorine atoms substituting the hydrogen atoms within the alkyl group, based on the total number of hydrogen atoms within the alkyl group) is preferably from 10 to 100%, more preferably from 50 to 100%, and it is particularly desirable that all of the hydrogen atoms are substituted with fluorine atoms, as the acid strength increases.

$R^{51}$ is most preferably a linear alkyl group or fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom for $R^{52}$ include a fluorine atom, a bromine atom, a chlorine atom and an iodine atom, and a fluorine atom is preferable.

The alkyl group for $R^{52}$ is linear or branched, and preferably has 1 to 5 carbon atoms, more preferably 1 to 4 carbon atoms, and most preferably 1 to 3 carbon atoms.

The halogenated alkyl group for $R^{52}$ is a group in which a part or all of the hydrogen atoms of the alkyl group have been substituted with halogen atoms. As the alkyl group of the halogenated alkyl group, the same alkyl group as those for $R^{52}$ may be mentioned. As the halogen atoms for substituting the hydrogen atoms of the alkyl group, the same halogen atom as those described above may be mentioned. In the halogenated alkyl group, it is preferable that 50 to 100% of the hydrogen atoms of the alkyl group be substituted with halogen atoms, and it is more preferable that all of the hydrogen atoms are substituted with halogen atoms.

The alkoxy group for $R^{52}$ is linear or branched, and preferably has 1 to 5 carbon atoms, more preferably 1 to 4 carbon atoms, and most preferably 1 to 3 carbon atoms.

Among these, as $R^{52}$, a hydrogen atom is particularly desirable.

$R^{53}$ represents an aryl group, preferably an aryl group of 6 to 20 carbon atoms, which may have a substituent, and examples of the basic ring excluding the substituent include a naphthyl group, a phenyl group and an anthracenyl group. In terms of the effects of the present invention and absorption of exposure ray such as ArF excimer laser, a phenyl group is preferable.

Examples of the substituent include a hydroxyl group and a lower alkyl group (linear or branched, and preferably no more than 5 carbon atoms, and a methyl group is particularly desirable).

As the aryl group for $R^{53}$, those which do not have a substituent are preferable, u" is an integer of 1 to 3, preferably 2 or 3, and it is particularly desirable that u" be 3.

As preferable examples of acid generators represented by general formula (b-0), the following can be mentioned,

[Chemical Formula 26]

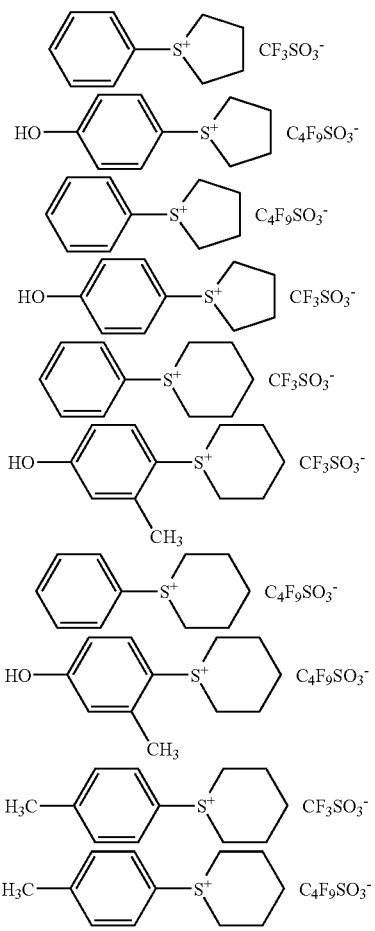

As the acid generator represented by general formula (b-0), one type may be used, or two or more types may be used in combination.

Further, as onium salt-based acid generators other than those represented by general formula (b-0), compounds represented by general formula (b-1) or (b-2) shown below can be preferably used.

[Chemical Formula 27]

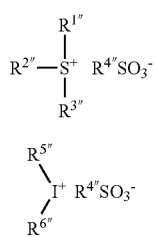

wherein $R^{1\prime\prime}$ to $R^{3\prime\prime}$, $R^{5\prime\prime}$ and $R^{6\prime\prime}$ each independently represents an aryl group or alkyl group; and $R^{4\prime\prime}$ represents a linear, branched or cyclic alkyl group or fluorinated alkyl group, with the proviso that at least one of $R^{1\prime\prime}$ to $R^{3\prime\prime}$ represents an aryl group (excluding the case where two of $R^{1\prime\prime}$ to $R^{3\prime\prime}$ represent a naphthyl group), and at least one of $R^{5\prime\prime}$ and $R^{6\prime\prime}$ represents an aryl group.

In formula (b-1), each of $R^{1\prime\prime}$ to $R^{3\prime\prime}$ independently represents an aryl group or an alkyl group. Among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ be aryl groups. However, the case where two of $R^{1\prime\prime}$ to $R^{3\prime\prime}$ represent a naphthyl group is excluded.

The aryl group for $R^{1\prime\prime}$ to $R^{3\prime\prime}$ is not specifically limited. For example, an aryl group having 6 to 20 carbon atoms may be used in which a part or all of the hydrogen atoms of the aryl group may or may not be substituted with alkyl groups, alkoxy groups or halogen atoms. The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not specifically limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of $R^{1\prime\prime}$ to $R^{3\prime\prime}$ be a phenyl group or a naphthyl group. However, the case where two of $R^{1\prime\prime}$ to $R^{3\prime\prime}$ represent a naphthyl group is excluded.

$R^{4\prime\prime}$ represents a linear, branched or cyclic alkyl group or fluorinated alkyl group.

As the linear, branched or cyclic alkyl group or fluorinated alkyl group for $R^{4\prime\prime}$, the same linear, branched or cyclic alkyl group or fluorinated alkyl group as those for $R^{14}$ can be mentioned.

In formula (b-2), each of $R^{5\prime\prime}$ and $R^{6\prime\prime}$ independently represents an aryl group or alkyl group. At least one of $R^{5\prime\prime}$ and $R^{6\prime\prime}$ represents an aryl group. It is preferable that both of $R^{5\prime\prime}$ and $R^{6\prime\prime}$ represent an aryl group.

As the aryl group for $R^{5\prime\prime}$ and $R^{6\prime\prime}$, the same aryl groups as those for $R^{1\prime\prime}$ to $R^{3\prime\prime}$ can be mentioned.

As the alkyl group for $R^{5\prime\prime}$ and $R^{6\prime\prime}$, the same alkyl groups as those for $R^{1\prime\prime}$ to $R^{3\prime\prime}$ can be mentioned.

It is particularly desirable that both of $R^{5\prime\prime}$ and $R^{6\prime\prime}$ represent a phenyl group.

As $R^{4\prime\prime}$ in formula (b-2), the same groups as those for $R^{4\prime\prime}$ in formula (b-1) above can be mentioned.

Specific examples of suitable onium salt-based acid generators represented by formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4- hydroxyaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, and diphenyl(1-(4-methoxy)naphthyl)sulfonium trifluoromethanesulfonate, heptafluoropropanesulfonate or nonafluorobutanesulfonate. It is also possible to use onium salts in which the anion moiety of these onium salts are replaced by methanesulfonate, n-propanesulfonate, n-butanesulfonate, or n-octanesulfonate.

Further, acid generators in which the anion moiety in general formula (b-1) or (b-2) is replaced with an anion moiety represented by general formula (b-3) or (b-4) above (the cation moiety is the same as (b-1) or (b-2)) may be used.

In the present description, an oximesulfonate-based acid generator is a compound having at least one group represented by general formula (B-1) shown below, and has a feature of generating acid by irradiation. Such oxime-sulfonate-based acid generators axe widely used for a chemically amplified resist composition, and can be appropriately selected.

[Chemical Formula 28]

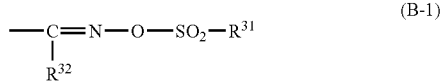

(B-1)

wherein $R^{31}$ and $R^{32}$ each independently represents an organic group.

In general formula (B-1) above, the organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group fox $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that a part or all of the hydrogen atoms of the alkyl group or the aryl group are replaced with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, partially or completely halogenated alkyl group (hereinafter, sometimes referred to as a "halogenated alkyl group") is particularly desirable. The "partially halogenated alkyl group" refers to an alkyl group in which a part of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which a part of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ se the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 29]

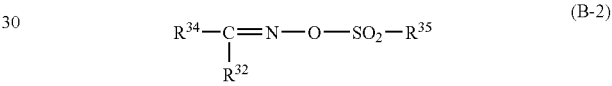

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group,

[Chemical Formula 30]

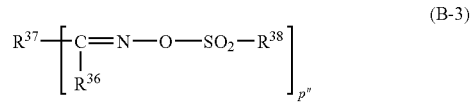

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As for the $R^{33}$, a halogenated alkyl group is preferable, and a fluorinated alkyl group is more preferable.

The fluorinated alkyl group for $R^{33}$ preferably has 50% or more of the hydrogen atoms of the alkyl group fluorinated, more preferably 70% or more, and still more preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthracyl group, and a phenantryl group, and heteroaryl groups in which a part of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, more preferably a fluorinated alkyl group, and most preferably a partially fluorinated alkyl group.

In terms of enhancing the strength of the acid generated, the fluorinated alkyl group for $R^{35}$ preferably has 50% or more of the hydrogen atoms of the alkyl group fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in International Application publication No. WO 2004/074242A2 (Examples 1 to 40 described at pages 65 to 85) may be preferably used.

Furthermore, as preferable examples, the following can be mentioned

[Chemical Formula 31]

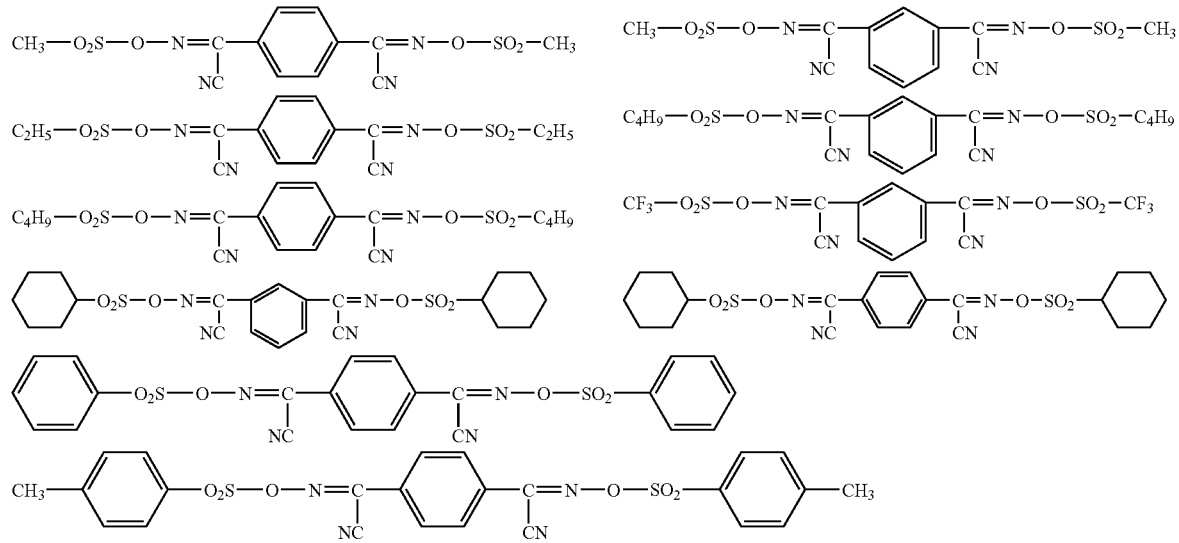

-continued
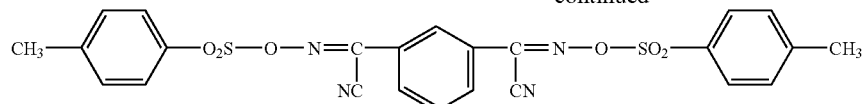
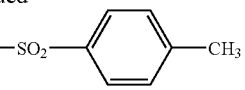
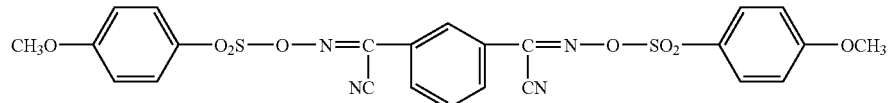
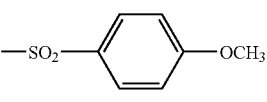
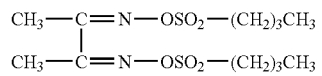
[Chemical Formula 32]
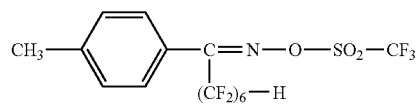
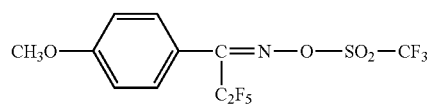
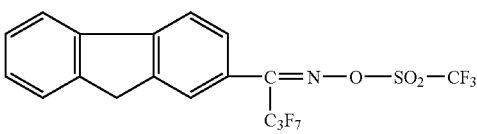
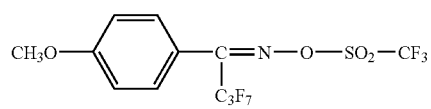
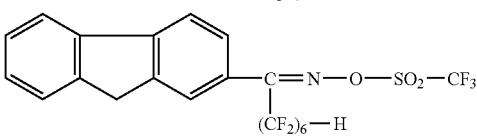
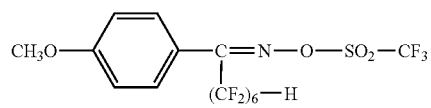
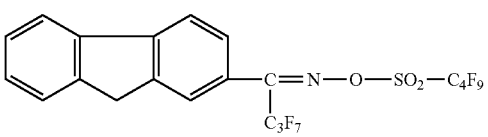
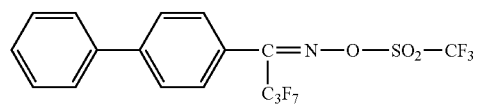
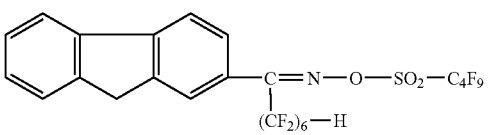
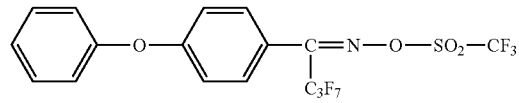
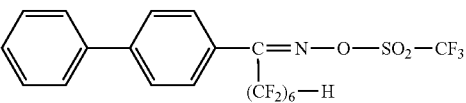
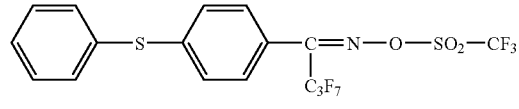
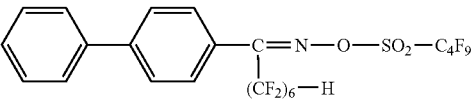
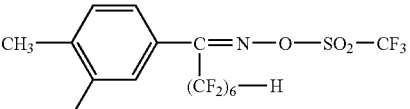
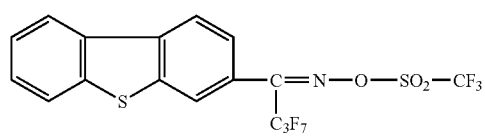
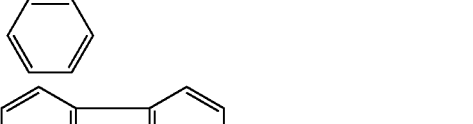
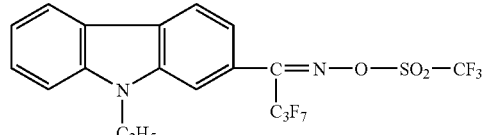
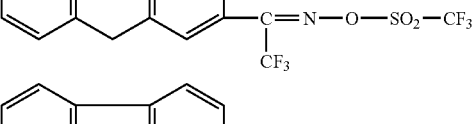
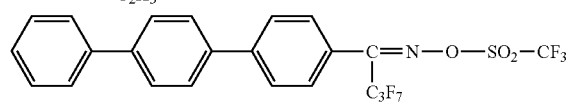
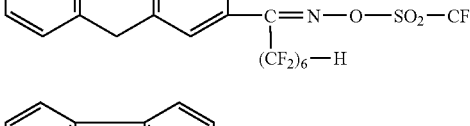
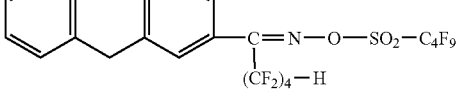

Among the above-mentioned compounds, the following 4 compounds are preferable.

[Chemical Formula 33]

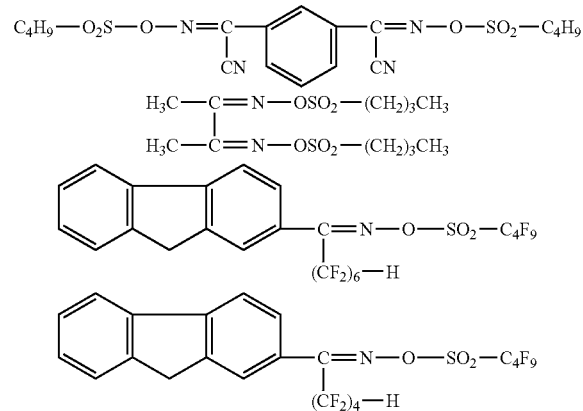

Of the aforementioned diazomethane-based acid generators, specific examples of suitable bisalkyl or bisaryl sulfonyl diazometanes include bis(isopropylsulfonyl)diazomethane, bis(p-toluenesulfonyl)diazomethane, bis(1,1-dimethylethyl-sulfonyldiazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bisphenylsulfonyl-diazomethylsulfonyl)butane, 1,6-bisphenylsulfonyldiazomethylsulfonyl)hexane, 1,10-bisphenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be mentioned.

Among the above-mentioned examples, it is preferable to use an onium salt having a fluorinated alkylsulfonic acid ion as the anion moiety.

As the component (B2), one type of acid generator may be used, or two or more types may be used in combination.

The amount of the entire component (B) within the positive resist composition of the present invention is preferably 0.5 to 30 parts by weight, and more preferably 1 to 10 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (D)>

In the positive resist composition of the present invention, for improving the resist pattern shape and the post exposure stability of the latent image formed by the pattern-wise exposure of the resist layer, it is preferable to add a nitrogen-containing organic compound (D) (hereafter referred to as the component (D)) as an optional component.

A multitude of these components (D) have already been proposed, and any of these known compounds may be used, although an aliphatic amine, and particularly a secondary aliphatic amine or tertiary aliphatic amine is preferable. In the present description and claims, the term "aliphatic" is a relative concept used in relation to the term "aromatic", and defines a group or compound that has no aromaticity.

The term "aliphatic cyclic group" refers to a monocyclic group or polycyclic group that has no aromaticity.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-octylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

The component (D) is typically used in an amount within a range from 0.01 to 5.0 parts by weight relative to 100 parts by weight of the component (A).

<Optional Component>

Furthermore, in the positive resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof an be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group.

Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-amyl ketone, methyl isoamyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, mono ethylether, monopropylether or monobutylether) or monophenylether of any of these polyhydric alcohols or compounds having an ester bond (among these, propylene glycol monomethyl ether acetate (PGMEA) and propylene glycol monomethyl ether (POME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as ansole, ethylbenzylether, cresylmethylether, diphenylether, dibenzylether, phenetole, butylphenylether, ethylbenzene, diethylbenzene, amylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME), EL and γ-butyrolactone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PFMEA:EL weight ratio is preferably from 1:9 to 9:1, and more preferably from 2:8 to 8:2. Alternatively, when POME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

Furthermore, as the component (S), a mixed solvent of a mixture of PGMEA and PGME with γ-butyrolactone is also preferable.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 2 to 20% by weight, and preferably from 5 to 15% by weight.

The positive resist composition of the present invention is capable of reducing LWR and exhibits the effect of suppressing development of footing which is likely to occur when a substrate having an inorganic antireflection film (inorganic BARC) formed thereon is used. The reasons for these have not yet been elucidated, but are presumed as follows.

In the present invention, a component (A) having the aforementioned structural unit (a1) is used. The structural unit (a1) contains a tertiary alkyl ester-type acid dissociable, dissolution inhibiting group containing an aliphatic monocyclic group and/or an aliphatic branched, tertiary alkyl ester-type acid dissociable, dissolution inhibiting group. These tertiary alkyl ester-type acid dissociable, dissolution inhibiting groups do not have a three-dimensionally bulky structure as compared to an acid dissociable, dissolution inhibiting group containing an aliphatic polycyclic group. Therefore, it is presumed that these tertiary alkyl ester-type acid dissociable, dissolution inhibiting groups are easily dissociated by action of acid. As a result, it is presumed that the exposed portions of the resist film are swiftly dissolved in a developing solution.

Further, in the present invention, the aforementioned component (B1) is used. The component (B1) exhibits a high transparency in the exposure wavelength range (especially in the wavelength band of ArF excimer laser), as compared to an acid generator having triphenylsulfonium (TPS) or the like as the cation moiety, and hence, can be blended in the positive resist composition in a large amount. As a result, the density of the acid generator within the resist film is increased, and it is presumed that the efficiency of generation of acid is further improved.

In the present invention, it is presumed that by virtue of using such a resin component (i.e., the component (A) including the structural unit (a1)) in combination with such an acid generator (ice, the component (B1)), not only can line width roughness (LWR) be reduced, but also an excellent effect of suppressing development of footing can be achieved which is likely to occur when a substrate having an inorganic antireflection film (inorganic BARC) formed thereon is used.

Moreover, in the present invention, an excellent PEB margin can be achieved.

The "PEB margin" is the change in the pattern size per unit temperature (nm/° C.) when the PEB temperature is changed during the formation of a resist pattern. The smaller the change in the size of the pattern, the better the PEB margin.

<<Method of Forming a Resist Patterns>>

Next, the method of forming a resist pattern according to the second aspect of the present invention will be described.

The method of forming a resist pattern according to the present invention includes: applying a positive resist composition of the first aspect to a substrate to form a resist film on the substrate; conducting exposure of the resist film; and developing the resist film to form a resist pattern.

The method of forming a resist pattern according to the present invention can be performed, for example, as follows.

Firstly, a positive resist composition of the present invention is applied onto a substrate such as a silicon wafer using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

As a substrate, for example, a silicon wafer can be used. Further, an organic or inorganic anti-reflective film may also be provided between the substrate and the applied layer of the positive resist composition.

By the positive resist composition according to the first aspect of the present invention, an excellent effect of suppressing development of footing can be achieved when an inorganic antireflection film is provided between the substrate and the applied coating layer of the positive resist composition. The inorganic antireflection film can be formed, for example, by applying an inorganic antireflection film composition (e.g., a silicon-based material) onto the substrate, followed by baking.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is particularly effective to ArF excimer laser.

EXAMPLES

As follows is a description of examples of the present invention, although the scope of the present invention is by no way limited by these examples.

<Resin Component (A)>

Polymers (A)-1 to (A)-3 used in the examples and comparative examples as the component (A) were synthesized in the following manner.

Taking example of the polymer (A)-1, PGMEA was charged into a flask equipped with a nitrogen inlet, a stirrer, a condenser and a thermometer in a nitrogen atmosphere, and the temperature of the water bath was elevated to 80° C. while stirring the content of the flask.

Then, a monomer solution obtained by mixing 2,2'-azobisisobutyronitrile (AIBN) as a polymerization initiator, PGMEA and monomers for deriving the respective structural units of polymer (A)-1 (1-ethyl-1-cyclohexyl methacrylate/α-methacryloyloxy γ-butyrolactone/3-hydroxy-1-adamantyl methacrylate=4/4/2 (molar ratio)) was dropwise added to the flask at a constant rate over 6 hours using a dispensing apparatus. The resultant was maintained at 80° C. for 1 hour. Thereafter, the reaction liquid was cooled to room temperatures.

Subsequently, the obtained reaction liquid was dropwise added to methanol in an amount of about 30 times the amount of the reaction liquid to obtain a colorless precipitate. The obtained precipitate was separated by filtration, and the precipitate was washed with methanol in an amount of about 30 times the amount of the monomers used for the polymerization. The resulting precipitate was separated by filtration and dried at 50° C. under reduced pressure for about 40 hours, thereby obtaining the polymer (A)-1.

The synthesis of the polymers (A)-2 and (A)-3 was performed in substantially the same manner as in the synthesis of the polymer (A)-1, except that the monomers for deriving the respective structural units of the polymers (A)-2 and (A)-3 were used in predetermined amounts.

The obtained polymers (A)-1 to (A)-3 are shown below.

The weight average molecular weight (Mw) and dispersity (Mw/Mn) of the polymers are also shown below. The weight average molecular weight (Mw) and dispersity (Mw/Mn) were determined by the polystyrene equivalent value as measured by gel permeation chromatography (GPC).

Furthers the compositional ratio was determined by carbon NMR. In the chemical formula, the subscript numerals of the respective structural units indicate the percentage (mol %) of the respective structural units within the copolymer.

[Chemical Formula 34]

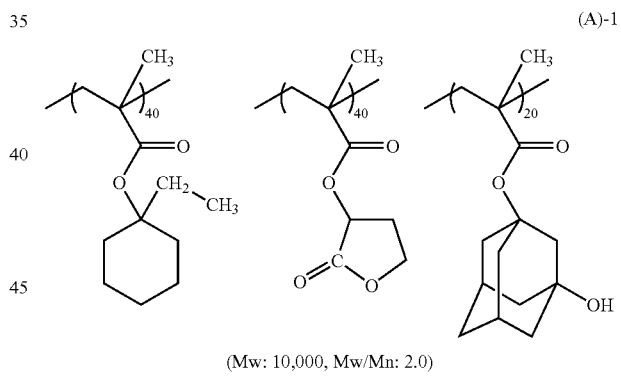

(Mw: 10,000, Mw/Mn: 2.0)

[Chemical Formula 35]

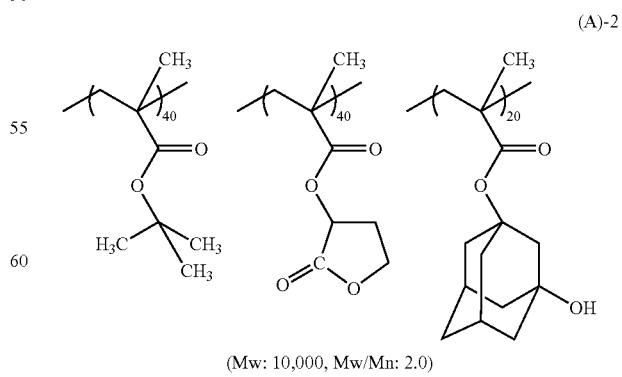

(Mw: 10,000, Mw/Mn: 2.0)

-continued

[Chemical Formula 36]

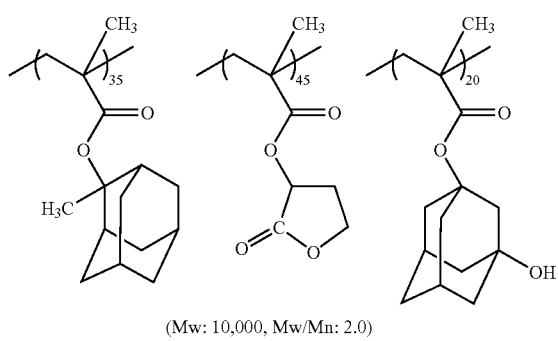

(A)-3

(Mw: 10,000, Mw/Mn: 2.0)

<Evaluation of Lithography Properties>

Using the obtained positive resist composition solutions, a resist pattern was formed on each of a substrate having an organic BARC provided thereon and a substrate having an inorganic BARC provided thereon. With respect to the formed resist patterns, the line width roughness (LWR), footing and PEB margin were evaluated as follows.

[Evaluation Using a Substrate Having an Organic BARC Provided Thereon]

An organic anti-reflection film composition (product name: ARC29, manufactured by Brewer Science Ltd.) was applied onto an 8-inch silicon wafer using a spinner, and the composition was then baked at 205° C. for 60 seconds, thereby forming an organic anti-reflection film having a film thickness of 77 nm.

Then, each of the positive resist composition solutions obtained in Examples 1 to 8 and Comparative Examples 1 to 3 was applied onto the organic anti-reflection film using a

TABLE 1

|  | Component (A) | | | Component (B) | | | Component (D) | Component (E) | Component (S) | |
|---|---|---|---|---|---|---|---|---|---|---|
| Ex. 1 | (A)-1 [100] | — | — | (B)-1 [7.0] | (B)-2 [1.0] | — | (D)-1 [1.20] | (E)-1 [0.50] | — | (S)-2 [1550] |
| Ex. 2 | (A)-1 [75] | (A)-2 [25] | — | (B)-1 [7.0] | (B)-2 [1.0] | — | (D)-1 [1.20] | (E)-1 [0.50] | — | (S)-2 [1550] |
| Ex. 3 | (A)-1 [50] | (A)-2 [50] | — | (B)-1 [7.0] | (B)-2 [1.0] | — | (D)-1 [1.20] | (E)-1 [0.50] | — | (S)-2 [1550] |
| Ex. 4 | (A)-1 [25] | (A)-2 [75] | — | (B)-1 [7.0] | (B)-2 [1.0] | — | (D)-1 [1.20] | (E)-1 [0.50] | — | (S)-2 [1550] |
| Ex. 5 | — | (A)-2 [100] | — | (B)-1 [7.0] | (B)-2 [1.0] | — | (D)-1 [1.20] | (E)-1 [0.50] | — | (S)-2 [1550] |
| Ex. 6 | (A)-1 [100] | — | — | (B)-1 [9.0] | — | — | (D)-2 [0.30] | (E)-1 [0.50] | — | (S)-2 [1550] |
| Ex. 7 | (A)-1 [50] | (A)-2 [50] | — | (B)-1 [9.0] | — | — | (D)-2 [0.30] | (E)-1 [0.50] | — | (S)-2 [1550] |
| Ex. 8 | — | (A)-2 [100] | — | (B)-1 [9.0] | — | — | (D)-2 [0.30] | (E)-1 [0.50] | — | (S)-2 [1550] |
| Comp. Ex. 1 | (A)-1 [100] | — | — | — | (B)-2 [1.0] | (B)-3 [4.5] | (D)-1 [1.20] | (E)-1 [0.50] | — | (S)-2 [1550] |
| Comp. Ex. 2 | — | — | (A)-3 [100] | (B)-1 [13.0] | — | — | (D)-2 [0.54] | (E)-1 [1.32] | (S)-1 [10] | (S)-2 [1550] |
| Comp. Ex. 3 | — | — | (A)-3 [100] | (B)-1 [9.0] | — | — | (D)-2 [0.30] | (E)-1 [0.50] | — | (S)-2 [1550] |

In Table 1, the reference characters indicate the following. Further, the values in brackets [ ] indicate the amount (in terms of parts by weight) of the component added.

(B)-1: di(1 naphthyl)phenylsulfonium nonafluorobutanesulfonate (B)-2: (4-methylphenyl)diphenylsulfonium nonafluorobutanesulfonate (B)-3: an acid generator represented by chemical formula shown below

[Chemical Formula 37]

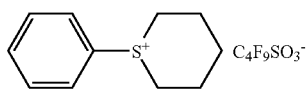

(D)-1: tri-n-octylamine
(D)-2: tri-n-pentylamine
(E)-1: salicylic acid
(S)-1: γ-butyrolactone
(S)-2: a mixed solvent of POMEA/PGME=6/4 (weight ratio)

spinner, and was then prebaked (PAB) on a hotplate at a temperature indicated in Table 2 for 60 seconds and dried, thereby forming a resist film having a film thickness of 150 nm.

Subsequently, the resist film was selectively irradiated with an ArF excimer laser (193 nm n) through a mask pattern, using an AF exposure apparatus NSR-S306 (manufactured by Nikon Corporation, NA (numerical aperture) 0.78, 2/3 annular illumination). Thereafter, a post exposure bake (PEB) treatment was conducted at a temperature indicated in Table 2 for 60 seconds, followed by development for 30 seconds at 23° C. in a 2.38% by weight aqueous solution of tetramethylammonium hydroxide. Then, the resist was washed for 30 seconds with pure water, followed by drying by shaking, thereby forming a line and space (1:1) resist pattern (L/S patter). In Examples 1 to 5 and Comparative Examples 1 and 2, the optimum exposure dose (sensitivity: Eop, mJ/cm$^2$) for forming a L/S pattern having a line width of 90 nm and a pitch of 180 nm was determined. In Examples 6 to 8, the optimum exposure dose (sensitivity: Eop, mJ/cm$^2$) for forming a L/S pattern having a line width of 80 nm and a pitch of 160 nm was determined.

(Evaluation of LWR)

With respect to each of the L/S patterns formed with the above-mentioned Eop, 5 points in the lengthwise direction of the line were measured using a measuring SEM (product name: S-9220, manufactured by Hitachi, Ltd.; applied voltage: 800V), and from the results, the value of 3 times the standard deviation s (i.e., 3s) was calculated as a yardstick of LWR. The results axe shown in Table 2.

The smaller this 3s value is, the lower the level of roughness of the line width, indicating that a resist pattern with a uniform width was obtained.

TABLE 2

|  | PAB temperature (° C.) | PEB temperature (° C.) | Eop (mJ/cm$^2$) | LWR (nm) |
| --- | --- | --- | --- | --- |
| Ex. 1 | 110 | 110 | 66.6 | 5.5 |
| Ex. 2 | 110 | 110 | 70.0 | 5.7 |
| Ex. 3 | 115 | 115 | 70.0 | 5.3 |
| Ex. 4 | 120 | 120 | 69.9 | 6.6 |
| Ex. 5 | 125 | 125 | 76.0 | 7.0 |
| Ex. 6 | 115 | 115 | 37.5 | 12.6 |
| Ex. 7 | 120 | 115 | 74.0 | 8.8 |
| Ex. 8 | 125 | 125 | 51.0 | 13.3 |
| Comp. Ex. 1 | 100 | 110 | 49.9 | 7.0 |
| Comp. Ex. 2 | 110 | 105 | 105.0 | 13.7 |

From the results shown in Table 2, it was confirmed that in Examples 1 to 5 which were within the scope of the present invention, the LWR values were small as compare to that in Comparative Example 1 in which no (B)-1 was contained in the positive resist composition, and resist patterns with a uniform width were obtained. Therefore, it was confirmed that in Examples 1 to 5, an excellent effect of reducing LWR was achieved.

Further, in Examples 6 to 8 which were within the scope of the present invention, the LWR values were small as compare to that in Comparative Example 2 in which a component (A) having no structural unit (A1) was contained in the positive resist composition, and resist patterns with a uniform width were obtained. Therefore, it was confirmed that in Examples 6 to 8, an excellent effect of reducing LWR was achieved.

[Evaluation Using a Substrate Having an Inorganic BARC Provided Thereon]

A composition for forming a lower layer (product name: BLC730, manufactured by Tokyo Ohka Kogyo Co., Ltd.) was applied onto an 8-inch silicon wafer, and the composition was heated at 250° C. for 90 seconds, thereby forming a lower layer having a film thickness of 250 nm. Then, an inorganic antireflection film composition (solid content: 2.5% by weight) obtained by dissolving a phenylsilsesquioxane/hydrogensilsesquioxane/methylsilsesquioxane copolymer (molar ratio: 9/20/71) in a mixed solvent of PGMEA and EL (weight ratio: 6/4) was applied onto the lower layer using a spinner, and was baked on a hotplate at 250° C. for 90 seconds and dried, thereby forming an inorganic antireflection film having a film thickness of 45 nm.

Next, each of the positive resist composition solutions obtained in Example 3 and Comparative Example 3 was applied onto the inorganic antireflection film using a spinner, and was then prebaked (PAB) on a hotplate at a temperature indicated in Table 3 for 60 seconds and dried, thereby forming a resist film having a film thickness of 120 nm.

Subsequently, the resist film was selectively irradiated with an ArF excimer laser (193 nm) through a mask pattern, using an ArF exposure apparatus NSR-S302 (manufactured by Nikon Corporation, NA (numerical aperture)=0.60, σ=0.75).

Thereafter, a post exposure bake (PEB) treatment was conducted at a temperature indicated in Table 3 for 60 seconds, followed by development for 30 seconds at 23° C. in a 2.38% by weight aqueous solution of tetramethylammonium hydroxide. Then, the resist was washed for 30 seconds with pure water, followed by drying by shaking, thereby forming a line and space (1:1) resist pattern (L/S pattern). The optimum exposure dose (sensitivity: Eop, mJ/cm$^2$) for forming a L/S pattern having a line width of 120 nm and a pitch of 240 nm was determined.

[Evaluation of Footing]

With respect to the L/S patterns having a line width of 120 nm and a pitch of 240 nm, the cross-sectional shape was observed using a scanning electron microscope (SEM), and the effect of suppressing development of footing was determined. The results are shown in Table 3.

TABLE 3

|  | PAB temperature (° C.) | PEB temperature (° C.) | Eop (mJ/cm$^2$) | Cross-sectional shape of L/S pattern |
| --- | --- | --- | --- | --- |
| Ex. 3 | 120 | 115 | 44.0 | Rectangular |
| Comp. Ex. 3 | 115 | 110 | 36.0 | Spreading at bottom portion (footing) |

From the results shown in Table 3, it was confirmed that in Example 3 which was within the scope of the present invention, the cross-sectional shape of the L/S pattern was rectangular, and hence, development of footing at the substrate interface was suppressed.

On the other hand, in Comparative Example 3, with respect to the cross-sectional shape, spreading was observed at the bottom portion of the L/S pattern, and hence, it was confirmed that development of footing was occurring at the substrate interface.

From the results above, it was confirmed that in Example 3 which was within the scope of the present invention, not only could LWR be reduced, but also an excellent effect of suppressing development of footing could be achieved which is likely to occur when a substrate having an inorganic antireflection film (inorganic BARC) is used.

(Evaluation of PEB Margin)

In the formation of a resist pattern using a positive resist composition solution of Example 3 which was performed in the manner as described above under [Evaluation using a substrate having an organic BARC provided thereon], the post exposure bake (PEB) temperature was changed to 105° C., 115° C., 120° C. and 125° C., and the resist pattern size (line width) of the pattern formed with each of the above PEB temperatures was measured using a measuring SEM.

Then, a straight line graph was plotted, taking the PEB temperature (° C.) on the horizontal axis and the resist pattern size on the vertical axis (Print CD; nm), and the relation of the line was determined.

The change in the pattern size per unit temperature (nm/° C.) accompanied by the change in PEB temperature was determined as the value of the gradient of the relation.

As a result, it was found that the change was 0.89 nm/° C.,

From this result, it was confirmed that in Example 3 which was within the scope of the present invention, the PEB margin was excellent.

Industrial Applicability

By the positive resist composition and method of forming a resist pattern according to the present invention, not only cm line width roughness (LWR) be reduced, but also an excellent effect of suppressing development of footing can be achieved which is likely to occur when a substrate having an inorganic antireflection film (inorganic BARC) formed thereon is used. Therefore, the present invention is extremely useful in industry.

The invention claimed is:

1. A positive resist composition comprising a resin component (A) which exhibits increased alkali solubility under action of acid and an acid-generator component (B) which generates acid upon exposure, said resin component (A) comprising a resin (A1) represented by general formula (A1-11) shown below, and a resin (A2) represented by general formula (A2-11) shown below, wherein the mixing ratio of said resin (A1) to said resin (A2) is 60:40 to 40:60, and wherein said acid-generator component (B) comprises an acid generator (B1) having a cation moiety represented by general formula (b'-1) shown below:

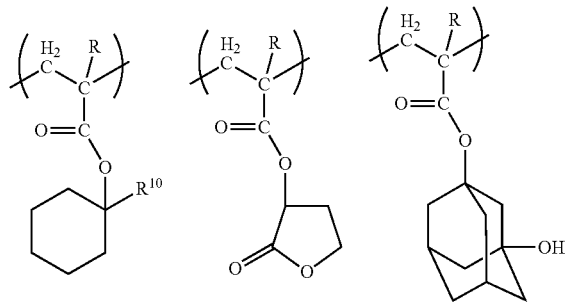

(A1-11)

wherein R represents a hydrogen atom, a halogen atom, a lower alkyl group or a halogenated lower alkyl group; and R¹⁰ represents a lower alkyl group;

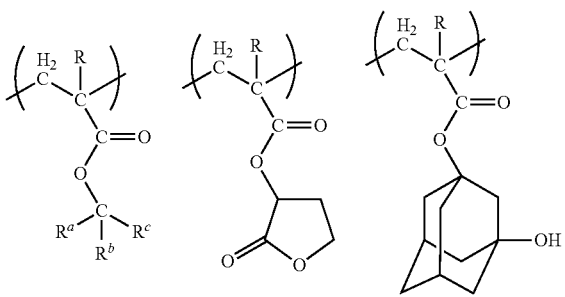

(A2-11)

wherein R represents a hydrogen atom, a halogen atom, a lower alkyl group or a halogenated lower alkyl group; and each of $R^a$ to $R^c$ independently represents a lower alkyl group; and

(b'-1)

wherein each of $R^1$ and $R^2$ independently represents a naphthyl group which may have a substituent; and $R^3$ represents an alkyl group or an aryl group exclusive of a naphthyl group, wherein the amount of said acid generator (B1) based on the entire acid-generator component (B) is 80% by weight or more.

2. The positive resist composition according to claim 1, which further comprises a nitrogen-containing organic compound (D).

3. A method of forming a resist pattern, comprising: applying the positive resist composition of claim 1 or claim 2 to a substrate to form a resist film on the substrate; conducting exposure of said resist film; and developing said resist film to form a resist pattern.

* * * * *